(12) United States Patent
Li et al.

(10) Patent No.: US 11,927,639 B2
(45) Date of Patent: Mar. 12, 2024

(54) HIGH-VOLTAGE INTERLOCKING DEVICE AND METHOD FOR DETECTING THE HIGH-VOLTAGE INTERLOCKING DEVICE

(71) Applicant: Contemporary Amperex Technology Co., Limited, Ningde (CN)

(72) Inventors: Weiqiang Li, Ningde (CN); Yanhui Fu, Ningde (CN); Xingchang Wang, Ningde (CN); Changjian Liu, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 0 days.

(21) Appl. No.: 17/490,055

(22) Filed: Sep. 30, 2021

(65) Prior Publication Data

US 2022/0018905 A1  Jan. 20, 2022

Related U.S. Application Data

(63) Continuation of application No. PCT/CN2021/081310, filed on Mar. 17, 2021.

(30) Foreign Application Priority Data

Jun. 12, 2020 (CN) .......................... 202010538310.4

(51) Int. Cl.
*G01R 31/00* (2006.01)
*B60R 16/03* (2006.01)
(Continued)

(52) U.S. Cl.
CPC .............. *G01R 31/36* (2013.01); *B60R 16/03* (2013.01); *G01R 31/006* (2013.01); *G01R 31/52* (2020.01)

(58) Field of Classification Search
USPC ...................... 324/503, 762.08, 556; 340/651
See application file for complete search history.

(56) References Cited

U.S. PATENT DOCUMENTS 6,222,374 B1 * 4/2001 Shoemaker .......... G01R 31/005
324/503
2017/0292982 A1 10/2017 Aceña et al.
(Continued)

FOREIGN PATENT DOCUMENTS

CN 103176070 A 6/2013
CN 104203635 B 9/2016
(Continued)

OTHER PUBLICATIONS

The International search report for PCT Application No. PCT/CN2021/081310, dated Jun. 2, 2021, 14 pages.
(Continued)

*Primary Examiner* — Nincent Q Nguyen
(74) *Attorney, Agent, or Firm* — Law Offices of Liaoteng Wang

(57) ABSTRACT

The application provides a high-voltage interlocking device and method for detecting the high-voltage interlocking device. The high-voltage interlocking device includes a first resistance module; a first switch module, a second connection end of the first switch module being connected to a first reference potential through a third resistance module, and a control terminal of the first switch module being configured to receive a first driving signal, to enable the first switch module to be turned on or off; a second resistance module, another end of the second resistance module being connected to a second reference potential; a fourth resistance module; a second switch module, a second connection end of the second switch module being connected to a third reference potential through a fifth resistance module; a fault
(Continued)

detection module, configured to determine a fault of the high-voltage component underdetection according to a first detection signal.

18 Claims, 6 Drawing Sheets

(51) Int. Cl.
    *G01R 31/36*     (2020.01)
    *G01R 31/52*     (2020.01)

(56) References Cited

U.S. PATENT DOCUMENTS

| | | | |
|---|---|---|---|
| 2019/0128948 A1 | 5/2019 | Smith et al. | |
| 2019/0176654 A1 | 6/2019 | Lee | |
| 2020/0274289 A1* | 8/2020 | Li | G01R 31/316 |

FOREIGN PATENT DOCUMENTS

| | | |
|---|---|---|
| CN | 107219437 A | 9/2017 |
| CN | 107291000 A | 10/2017 |
| CN | 108469566 A | 8/2018 |
| CN | 109017317 A | 12/2018 |
| CN | 109188169 A | 1/2019 |
| CN | 109541494 A | 3/2019 |
| CN | 109664841 A | 4/2019 |
| CN | 110231535 A | 9/2019 |
| CN | 110261712 A | 9/2019 |
| CN | 110967616 A | 4/2020 |
| CN | 110967617 A | 4/2020 |
| JP | 2007078585 A | 3/2007 |
| JP | 2009077627 A | 4/2009 |
| KR | 20140143625 A | 12/2014 |

OTHER PUBLICATIONS

The First Office Action dated Jul. 5, 2022 for Chinese Application No. 202010538310.4, 25 pages.
The First Office Action for Japanese Application No. 2022-542924 dated Dec. 5, 2022, 4 pages.

\* cited by examiner

Open circuit occurring in the high-voltage component
G under detection

Short ground occurring in the high-voltage
component G under detection

HIGH-VOLTAGE INTERLOCKING DEVICE AND METHOD FOR DETECTING THE HIGH-VOLTAGE INTERLOCKING DEVICE

CROSS-REFERENCE TO RELATED APPLICATION

This application is a continuation of International Application No. PCT/CN2021/081310, filed on Mar. 17, 2021, which claims priority to Chinese Patent Application No. 202010538310.4, filed on Jun. 12, 2020, both of which are incorporated herein by reference in its entirety.

FIELD

The present application relates to the technical field of batteries, and in particular, to a high-voltage interlocking device and a method for detecting the high-voltage interlocking device.

BACKGROUND

With the rapid development of new energy vehicles, people are paying more and more attentions to the safety of new energy vehicles. The biggest difference between a new energy vehicle and a traditional vehicle is that the new energy vehicle relies on a high voltage and high current to provide power for the vehicle. Therefore, high-voltage safety issues cannot be ignored in the design of new energy vehicles. A high-voltage interlocking device is a common high-voltage loop safety monitoring system that is mainly used to monitor on-off states of various high-voltage components of electric vehicles, such as high-voltage connectors, Manual Maintenance Switches (MSDs), or high-voltage power supply equipment. A vehicle controller may determine, according to the detected situation, whether to disconnect a high-voltage circuit, to keep the vehicle in a safe state.

In existing detection schemes, a voltage is applied to an end of a high-voltage component under detection, and another voltage is collected by a voltage collecting module at another end of the high-voltage component. The applied voltage and the collected voltage is compared to determine whether the high-voltage component under detection is faulty or not. It is thus needed a detection scheme being able to diagnose more types of faults of the high-voltage component under detection.

SUMMARY

Embodiments of the present application provide a high-voltage interlocking device and method for detecting the high-voltage interlocking device.

On an aspect, the present application provides a high-voltage interlocking device, comprising:

a first resistance module, an end of the first resistance module being connected to a first connection end of a first switch module, a first connection end of a high-voltage component under detection, and an end of a second resistance module respectively, and another end of the first resistance module being connected to a first power terminal;

the first switch module, a second connection end of the first switch module being connected to a first reference potential through a third resistance module, and a control terminal of the first switch module being configured to receive a first driving signal to enable the first switch module to turn on or off according to the first driving signal;

the second resistance module, another end of the second resistance module being connected to a second reference potential;

a fourth resistance module, an end of the fourth resistance module being connected to another end of the high-voltage component under detection and a first connection end of a second switch module, and another end of the fourth resistance module being connected to a second power terminal;

the second switch module, a second connection end of the second switch module being connected to a third reference potential through a fifth resistance module, and a control terminal of the second switch module being configured to receive a second driving signal to enable the second switch module to turn on or off according to the second driving signal;

a fault detection module, configured to determine a fault of the high-voltage component under detection according to a first detection signal obtained from the first connection end of the high-voltage component under detection, wherein the fault of the high-voltage component under detection comprises a short power supply fault, an open-circuit fault or a short-ground fault, wherein an on-off state of the first switch module is opposite to an on-off state of the second switch module, when the first switch module is turned on, power of the high-voltage interlocking device is supplied by the second power terminal, and when the second switch module is turned on, the power of the high-voltage interlocking device is supplied by the first power terminal.

On another aspect, the present application provides a high-voltage interlocking device detection method, applicable to the high-voltage interlocking device of any embodiment of the first aspect of the present application, the method comprising: obtaining, by the fault detection module, the first detection signal from the end of the second resistance module; and determining, by the fault detection module, the fault of the high-voltage component under detection according to the first detection signal, wherein the fault of the high-voltage component under detection comprises any of a short power supply fault, an open-circuit fault or a short-ground fault.

BRIEF DESCRIPTION OF THE DRAWINGS

In order to illustrate technical solutions of embodiments of the present application more clearly, drawings necessary for the embodiments of the present application will be introduced briefly below. Obviously, the drawings described below are only some embodiments of the present application, and other drawings may be obtained from those drawings by those having ordinary skills in the art without any creative work.

Figure 1:
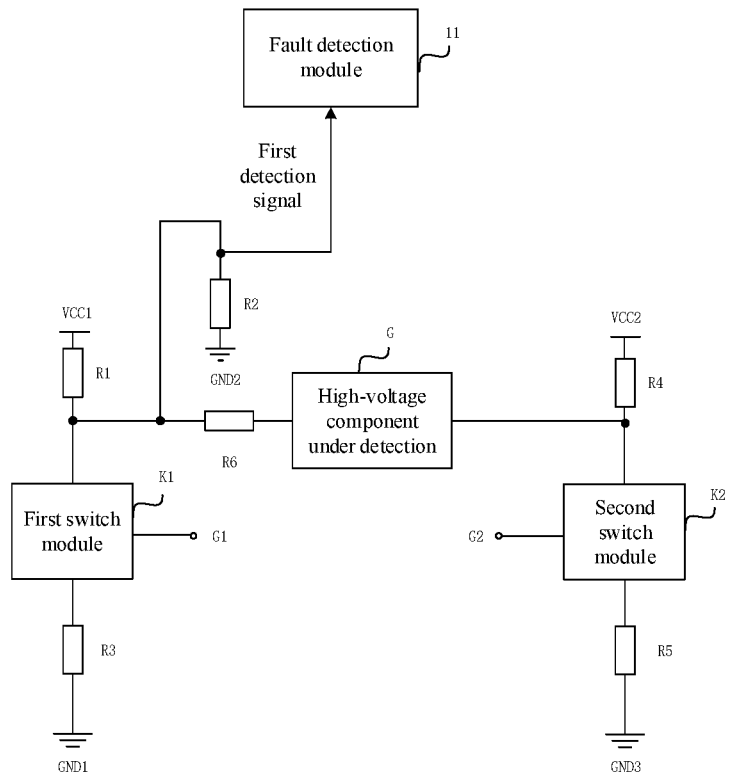
FIG. 1 is a schematic structural diagram of a high-voltage interlocking device, provided by an embodiment of the present application.

In the drawings, figures may not be drawn to actual scale.

DETAILED DESCRIPTION

Implementations of the present application are described in further details below with reference to the drawings and embodiments. The following detailed description of the embodiments and drawings are used to illustrate principles of the present application exemplarily, instead of limiting the scope of the present application. That is, the present application is not limited to the described embodiments.

In the description of the application, it should be noted that, unless otherwise stated, "a plurality of" means two or more; the terms "top", "bottom", "left", "right", "inside", and "outside" used to indicate orientation or position relationships are only for purpose of facilitating the description of the application and simplifying the description, and do not indicate or imply that a device or element referred to must have a specific orientation, be constructed and operated in a specific orientation, and therefore cannot be understood as limitations to the application. In addition, the terms "first", "second", "third", etc. are only used for descriptive purposes, and cannot be understood as indicating or implying relative importance. "Vertical" is not strictly vertical, but within an allowable range of error. "Parallel" is not strictly parallel, but within an allowable range of error.

The orientation words appearing in the following description are all directions shown in the figures, and do not limit the specific structure of the application. In the description of the application, it should also be noted that, unless otherwise explicitly stated and defined, the terms "installation", "interconnection", and "connection" should be understood in a broad sense, for example, it may be a fixed connection or a detachable connection, an integral connection; it may be a direct connection or an indirect connection through an intermediate medium. For those of ordinary skills in the art, specific meanings of the above-mentioned terms in this application may be understood according to specific circumstances.

The orientation words appearing in the following description are all directions shown in the figure, and do not limit the specific structure of the application. In the description of this application, it should also be noted that, unless otherwise clearly defined and limited, the terms "installation", "connection", and "connection" should be understood in a broad sense, for example, it may be a fixed connection or an optional connection. Disassembly connection, or integral connection; it can be directly connected or indirectly connected through an intermediate medium. For those of ordinary skill in the art, the specific meaning of the above-mentioned terms in this application can be understood according to specific circumstances.

Embodiments of the present application provide a high-voltage interlocking device and a method for detecting the high-voltage interlocking device, which are suitable for specific scenarios of fault detection of high-voltage devices. For a high-voltage component under detection, if no fault happens therein, the high-voltage component under detection is in a normal state; if a fault occurs therein, the high-voltage component under detection may suffer from a fault type including particularly a short power supply fault, a short-ground fault and an open-circuit fault. The short power supply fault means that any or both ends of the high-voltage component under detection short-circuit a power supply, which may be an unknown power supply. The short-ground fault means that any or both ends of the high-voltage component under detection are short grounded. The open-circuit fault means that the interior of the high-voltage component under detection is always disconnected, that is, the interior of the high-voltage component under detection is always electrically disconnected.

FIG. 1 is a schematic structural diagram of a high-voltage interlocking device, provided by an embodiment of the present application. In an embodiment, the high-voltage interlocking device of the embodiment of the present application may be implemented as a high-voltage interlocking circuit, or another structure that can realize the function of the high-voltage interlocking device of the embodiment of the present application, which is not limited specifically herein.

As shown in FIG. 1, the high-voltage interlocking device may include a first resistance module R1, a first switch module K1, a second resistance module R2, a third resistance module R3, a fourth resistance module R4, a second switch module K2, and a fault detection module 11.

Regarding the first resistance module R1, an end of the first resistance module R1 is connected to a first connection end of a first switch module K1, a first connection end of a high-voltage component G under detection, and an end of the second resistance module R2, respectively. Another end of the first resistance module R1 is connected to a first power terminal VCC1. Specifically, the first resistance module R1 may include one or more connected resistors, or electrical connection wires with resistors. In an embodiment, a voltage of the first power terminal VCC1 is less than or equal to a voltage of a low-voltage power supply within the vehicle. In an example, the first power terminal VCC1 may be a lead-acid battery of the finished vehicle.

Regarding the first switch module K1, the first switch module K1 includes a control terminal G1, a first connection end and a second connection end. In an example, the first switch module K1 may be implemented specifically as a triode, a Metal Oxide Semiconductor (MOS) field effect transistor and so on. Particularly, the first switch module K1 may be implemented specifically as an NPN type triode or a PNP type triode, and conduction voltages corresponding to the two types of triodes are different. Similarly, the first switch module K1 may be implemented specifically as an N-channel MOS transistor or a P-channel MOS transistor, and turn-on voltages corresponding to the two MOS transistors are different.

The control terminal G1 of the first switch module K1 is used to receive a first driving signal, to enable the first switch to be turned on or off module according to the first driving signal. The first driving signal includes a first level signal and a second level signal. When the first level signal is applied to the control terminal G1, the first switch module K1 is turned on, and the first connection end and the second connection end of the first switch module K1 are then electrically connected. When the second level signal is applied to the control terminal G1, the first switch module K1 is turned off, and the first connection end and the second connection end of the first switch module K1 are then electrically disconnected.

The first connection end of the first switch module K1 is also connected to the end of the second resistance module R2 and the first connection end of the high-voltage component G under detection. Exemplarily, as shown in FIG. 1, the first connection end of the first switch module K1 and the end of the second resistance module R2 are both connected to a line between the first switch module K1 and the first connection end of the high-voltage component under detection.

The second connection end of the first switch module K1 is connected to the first reference potential through the third resistance module R3. Exemplarily, as shown in FIG. 1, the first reference potential may be a ground terminal GND1.

Regarding the second resistance module R2, the end of the second resistance module R2 is connected to the end of the high-voltage component G under detection. Another end of the second resistance module R2 is connected to a second reference potential. Exemplarily, as shown in FIG. 1, the second reference potential may be a ground terminal GND2.

Regarding the fourth resistance module R4, an end of the fourth resistance module R4 is connected to another end of the high-voltage component G under detection and a first connection end of the second switch module K2. Another end of the fourth resistance module R4 is connected to a second power terminal VCC2. For specific content of the second power terminal VCC2, please refer to the related description of the first power terminal VCC1, which will not be repeated here. The voltages of the second power terminal VCC2 and the first power terminal VCC1 may be equal or unequal. The second power terminal VCC2 and the first power terminal VCC1 may be the same power supply or different power supplies, which is not limited specifically herein.

Regarding the second switch module K2, the second switch module K2 includes a control terminal G2, the first connection end, and a second connection end. For specific content of the second switch module K2, please refer to the related description of the first switch module K1, which will not be repeated here.

The control terminal G2 of the second switch module K2 is used to receive a second driving signal, to enable the second switch module to be turned on or off according to the second driving signal.

The first connection end of the second switch module K2 is also connected to the another end of the high-voltage component G under detection. Exemplarily, as shown in FIG. 1, the first connection end of the second switch module K2 may be connected to a line between the end of the fourth resistance module R4 and the another end of the high-voltage component G under detection.

The second connection end of the second switch module K2 is connected to a third reference potential through a fifth resistance module R5. Exemplarily, as shown in FIG. 1, the third reference potential may be a ground terminal GND3.

Regarding the fault detection module 11, the fault detection module 11 is configured to determine the fault of the high-voltage component G under detection according to a first detection signal obtained from the first connection end of the high-voltage component G under detection. The fault detection module 11 may be implemented specifically as a fault diagnosis module 13, which may be implemented specifically as a Vehicle Control Unit (VCU), a Motor Control Unit (MCU), or a Battery Management System (BMS), etc. In an example, the fault diagnosis module 13 may output the first driving signal and/or second driving signal to control the on and off of the first switch module K1 and the second switch module K2.

In addition, in embodiments of the present application, in a process of collecting the first detection signal, the on-off state of the first switch module K1 is opposite to the on-off state of the second switch module K2. That is, there are two states: a first state, i.e., the first switch module K1 is on and the second switch module K2 is off; and a second state, i.e., the first switch module K1 is off and the second switch module K2 is on.

In an embodiment, continuing to refer to FIG. 1, the end of the high-voltage component G under detection is connected to other modules through a sixth resistance module R6. That is, the end of the high-voltage component G under detection is connected to an end of the sixth resistance module R6, and another end of the sixth resistance module R6 is connected to the end of the first resistance module R1, the end of the second resistance module R2, and the first connection end of the first switch module K1, respectively.

Power of the high-voltage interlocking device and paths through which current flows will be described in details below, in conjunction with on-off states of the first switch module K1 and the second switch module K2 and a state of the high-voltage component G under detection.

I. The high-voltage component G under detection is in a normal state.

Firstly, when the first switch module K1 is turned on and the second switch module K2 is turned off, the power of the high-voltage interlocking device is supplied by the second power terminal VCC2. At this time, the current flows through two paths. Path 1 is The second power terminal VCC2→the fourth resistance module R4→the high-voltage component G under detection→the first switch module K1→the third resistance module R3→the first reference potential. Path 2 is the second power terminal VCC2→the fourth resistance module R4→the high-voltage component G under detection→the second resistance module R2→the second reference potential.

In an example, when the sixth resistance module R6 is connected to one end of the high-voltage component G under detection, if the resistance of the high-voltage component under detection in an ideal state is 0, a voltage $V_{N11}$ of the first detection signal meets an equation (1):

$$V_{N11}=V_{CC2} \times R_a/(R_a+R_4+R_6) \qquad (1)$$

In the equation (1), $V_{CC2}$ represents the voltage of the second power terminal VCC2, $R_a$ represents a parallel resistance value of the second resistance module R2 and the third resistance module R3, $R_4$ represents a resistance value of the fourth resistance module R4, and $R_6$ represents a resistance value of the sixth resistance module R6.

In another example, when the sixth resistance module R6 is not connected to the end of the high-voltage component G under detection, if the resistance of the high-voltage component under detection in an ideal state is 0, the parameter $R_6$ is omitted in equation (1).

Secondly, when the first switch module K1 is turned off and the second switch module K2 is turned on, the power of the high voltage interlocking device is supplied by the first power terminal VCC1. At this time, the current flows through two paths. Path 1 is the first power terminal VCC1→the high-voltage component G under detection→the second switch module K2→the fifth resistance module R5→the third reference potential. Path 2 is the first power terminal VCC1→the second resistance module R2→the second reference potential.

In this case, if the resistance of the high-voltage component under detection in an ideal state is 0, a voltage $V_{N12}$ of the first detection signal meets an equation (2):

$$V_{N12}=V_{CC1} \times R_b/(R_b+R_1) \qquad (2)$$

In the equation (2), $V_{CC2}$ represents the voltage of the first power terminal VCC1, $R_1$ represents a resistance value of the first resistance module R1. In an embodiment, $V_{N12}$ is larger than $V_{N11}$.

In an example, when the sixth resistance module R6 is not connected to the end of the high-voltage component G under detection, $R_b$ represents a parallel resistance value of the fifth resistance module R5 and the second resistance module R2.

In another example, when the sixth resistance module R6 is connected to the end of the high-voltage component G under detection, $R_b$ represents a parallel resistance value of a series resistance of the sixth resistance module R6 and the fifth resistance module R5, and the second resistance module R2, i.e., $R_b=[R_2(R_6+R_S)]/(R_6+R_S+R_2)$.

Figure 2A:
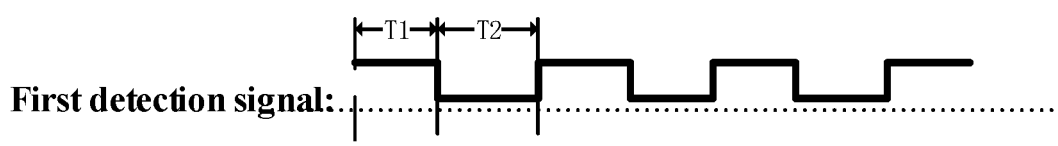
FIG. 2A is an exemplary waveform diagram of a first detection signal corresponding to a high-voltage component under detection in a normal state, provided by an embodiment of the present application.

As an example, the first detection signal corresponding to the high-voltage component under detection in the normal state of the embodiment of the present application may be the exemplary waveform diagram shown in FIG. 2A. As shown in FIG. 2A, if the first drive signal and the second drive signal are periodic pulse signals, the first detection signal generated by turning off the first switch module K1 and the second switch module K2 alternately under control of the first drive signal and the second drive signal, is also a periodic pulse signal. Particularly, each alternate period includes a first time period T1 and a second time period T2. In the first time period T1, the first switch module K1 is turned off and the second switch module K2 is turned on, which corresponds to a high-level sub-signal of the first detection signal in FIG. 2A. A voltage of the high-level sub-signal is $V_{N12}$. In the second time period T2, the first switch module K1 is turned on and the second switch module K2 is turned off, which corresponds to a low-level sub-signal of the first detection signal in FIG. 2A. A voltage of the low-level sub-signal is $V_{N11}$. The dashed-dotted line in FIG. 2A represents a reference line, a voltage of which is zero.

II. A short power supply fault occurs in the high-voltage component G under detection. When the short power supply fault occurs in the high-voltage component G under detection, it can be considered that both ends of the high-voltage component G under detection have high voltages $V_X$. In some application scenarios, a value of $V_X$ may be between 8V and 24V.

Firstly, when the first switch module K1 is turned on and the second switch module K2 is turned off, although the power of the high-voltage interlocking device is supplied by the second power terminal VCC2, the end of the high-voltage component G under detection has the high voltage $V_X$. Illustratively, the current flows through 3 paths. Path 1 is the end of the high-voltage component G under detection→the sixth resistance module R6 (if the sixth resistance module R6 is not connected to the end of the high-voltage component G under detection, the sixth resistance module R6 is not included)→the first switch module K1→the third resistance module R3→the first reference potential. Path 2 is the end of the high-voltage component G under detection→the sixth resistance module R6 (if the sixth resistance module R6 is not connected to the end of the high-voltage component G under detection, the sixth resistance module R6 is not included)→the second resistance module R2→the second reference potential. Path 3 is the end of the high-voltage component G under detection→the sixth resistance module R6 (if the sixth resistance module R6 is not connected to the end of the high-voltage component G under detection, the sixth resistance module R6 is not included)→the first resistance module R1→the power terminal VCC1. In an embodiment, if the voltage of the collected first detection signal is $V_{N21}$, and a voltage of the short-circuited power supply is greater than the voltage of the second power terminal VCC2, $V_{N21}$ is larger than $V_{N11}$.

In an example, when the sixth resistance module R6 is connected to the end of the high-voltage component G under detection, if the resistance of the high-voltage component under detection in an ideal state is 0, the voltage $V_{N21}$ of the first detection signal meets an equation (3):

$$V_{N21}=(V_X/R_6+V_{CC1}/R_1)/(1/R_1+1/R_2+1/R_3+1/R_6) \qquad (3)$$

It should be noted that a calculation principle for the case where the sixth resistance module R6 is not connected to the end of the high-voltage component G under detection is similar, which will not be repeated here.

Secondly, when the first switch module K1 is turned off and the second switch module K2 is turned on, the power of the high voltage interlocking device is supplied by the first power terminal VCC1. At this time, the voltage of the first detection signal equals approximately the voltage $V_X$ of the short-circuited power. $V_{N22}$ is larger than $V_{N12}$ and $V_{N22}$ is larger than $V_{N21}$.

Figure 2B:
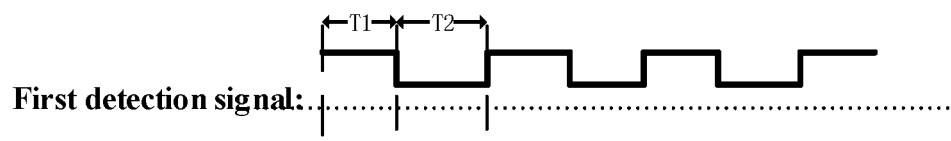
FIG. 2B is an exemplary waveform diagram of a first detection signal corresponding to a high-voltage component under detection where a short power supply fault occurs, provided by an embodiment of the present application.

As an example, the first detection signal corresponding to the high-voltage component under detection of the embodiment of the present application, where the short power supply fault occurs, may be an exemplary waveform diagram shown in FIG. 2B. In the first time period T1, the first switch module K1 is turned off and the second switch module K2 is turned on, the first detection signal is a high-level sub-signal as shown in FIG. 2B. A voltage of the high-level sub-signal is $V_{N22}$, which is larger than $V_{N12}$ shown in FIG. 2A. In the second time period T2, the first switch module K1 is turned on and the second switch module K2 is turned off, first detection signal is a low-level sub-signal as shown in FIG. 2B. A voltage of the low-level sub-signal is $V_{N21}$, which is larger than $V_{N11}$ shown in FIG. 2A.

III. An open-circuit fault occurs in the high-voltage component G under detection.

Firstly, when the first switch module K1 is turned on and the second switch module K2 is turned off, the power of the high-voltage interlocking device is supplied by the second power terminal VCC2. In this case, due to the open-circuit fault of the high-voltage component G under detection, a current output by the second power terminal VCC2 cannot flow into a circuit of the end of the high-voltage component G under detection. The voltage $V_{N31}$ of the first detection signal equals approximately 0.

Secondly, when the first switch module K1 is turned off and the second switch module K2 is turned on, the power of the high voltage interlocking device is supplied by the first power terminal VCC1. At this time, the current flows through one path, that is, the first power terminal VCC1→the second resistance module R2→the second reference potential.

At this time, if the resistance of the high-voltage component under detection in an ideal state is 0, a voltage $V_{N32}$ of the first detection signal meets an equation (4):

$$V_{N32}=V_{CC1} \times R_3/(R_3+R_1) \quad (4)$$

It should be noted that, regardless of whether the sixth resistance module R6 is connected to one end of the high-voltage component G under detection, the above equation (4) is satisfied.

In an embodiment, $V_{N32}$ is larger than $V_{N31}$, and $V_{N32}$ is larger than $V_{N12}$.

Figure 2C:
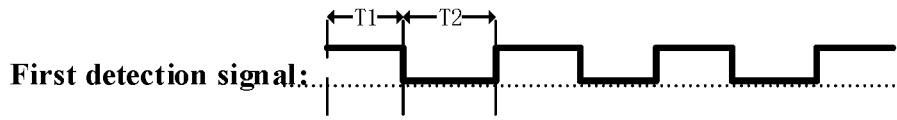
FIG. 2C is an exemplary waveform diagram of a first detection signal corresponding to a high-voltage component under detection where an open-circuit fault occurs, provided by an embodiment of the present application.

As an example, the first detection signal corresponding to the high-voltage component under detection of the embodiment of the present application, where the open-circuit fault occurs, may be an exemplary waveform diagram shown in FIG. 2C. In the first time period T1, the first switch module K1 is turned off and the second switch module K2 is turned on, the first detection signal is a high-level sub-signal as shown in FIG. 2C. A voltage of the high-level sub-signal is $V_{N32}$, which is larger than $V_{N12}$ shown in FIG. 2A. In the second time period T2, the first switch module K1 is turned on and the second switch module is turned off, the first detection signal is a low-level sub-signal as shown in FIG. 2C. A voltage of the low-level sub-signal is approximately 0, which is smaller than $V_{N11}$ shown in FIG. 2A.

IV. The high-voltage component G under detection is in a short-ground state, equivalent to that both ends of the high-voltage component G under detection are grounded.

Firstly, when the first switch module K1 is turned on and the second switch module K2 is turned off, the power of the high-voltage interlocking device is supplied by the second power terminal VCC2. In this case, the current cannot flow into the end of the high-voltage component G under detection, and the voltage of the first detection signal is equal to a short-ground voltage. Since the short-ground voltage is 0 in an ideal state, the voltage of the first detection signal is 0 accordingly.

Secondly, when the first switch module K1 is turned off and the second switch module K2 is turned on, the power of the high voltage interlocking device is supplied by the first power terminal VCC1. At this time, when the sixth resistance module R6 is connected to the end of the high-voltage component G under detection, the current flows through two paths. Path 1 is the first power terminal VCC1→the first resistance module R1→the sixth resistance module R6→the end of the high-voltage component G under detection (the voltage of which is the short-ground voltage). Path 2 is the first power terminal VCC1→the first resistance module R1→the second resistance module R2→the second reference potential.

In an example, when the sixth resistance module R6 is connected to one end of the high-voltage component G under detection, if the resistance of the high-voltage component under detection in an ideal state is 0, the voltage $V_{N42}$ of the first detection signal meets the an equation (5):

$$V_{N42}=V_{CC1} \times R_c/(R_c+R_1) \quad (5)$$

In the equation (5), $R_c$ represents a parallel resistance value of the second resistance module R2 and the sixth resistance module R6, $V_{N42}$ is larger than $V_{N41}$, and $V_{N42}$ is smaller than $V_{N11}$.

In another example, when the sixth resistance module R2 is not connected to the end of the high-voltage component G under detection, the voltage $V_{N42}$ of the first detection signal is equal to the short-ground voltage. Since the short-ground voltage is 0 in an ideal state, the voltage of the first detection signal is 0 accordingly.

Figure 2D:
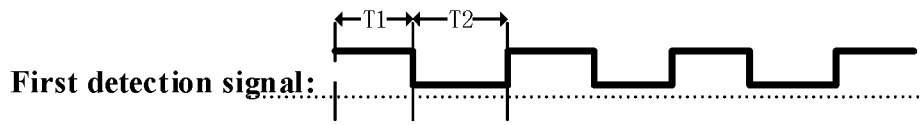
FIG. 2D is an exemplary waveform diagram of a first detection signal corresponding to a high-voltage component under detection where a short-ground fault occurs, provided by an embodiment of the present application.

As an example, when the sixth resistance module R6 is connected to one end of the high-voltage component G under detection, the first detection signal corresponding to the high-voltage component under detection of the embodiment of the present application, where the short-ground fault occurs, may be an exemplary waveform diagram shown in FIG. 2D. In the first time period T1, the first switch module K1 is turned off and the second switch module K2 is turned on, the first detection signal is a high-level sub-signal as shown in FIG. 2D, of which the voltage is $V_{N42}$. In the second time period T2, the first switch module K1 is turned on and the second switch module K2 is turned off, the first detection signal is a low-level sub-signal of as shown in FIG. 2D, of which the voltage is $V_{N41}$.

Based on the above analysis, in some embodiments, the first detection signal is a pulse signal, and the first detection signal may contain only a pulse signal generated by turning on/off the first switch module K1 and the second switch module K2 alternately for one time, i.e., including a low-level signal and a high-level signal. Alternatively, the first detection signal may be a periodic pulse signal representing turning on/off the first switch module K1 and the second switch module K2 N times. That is to say, the pulse signal includes totally N cycles, each of which includes a low-level signal and a high-level signal, where N is an integer greater than or equal to 1. N may be set according to specific scenarios and actual needs, which is not limited herein.

Correspondingly, the fault detection module 11 may be specifically configured to determine that the short power supply fault occurs in the high-voltage component under detection, under a condition that a high-level voltage of the first detection signal is equal to a first reference short power supply voltage, and/or a low-level voltage of the first detection signal is equal to a second reference short power supply voltage. The first reference short power supply voltage and the second reference short power supply voltage may be calculated based on the schematic circuit diagram shown in FIG. 1, or may be two values obtained during an experiment simulating a situation where the short power supply fault occurs in high-voltage component under detection.

The fault detection module 11 may also be specifically configured to determine that the open-circuit fault occurs in the high-voltage component under detection, under a condition that the high-level voltage of the first detection signal is equal to a first reference open-circuit voltage, and/or the low-level voltage of the first detection signal is equal to a second reference open-circuit voltage. In an example, the first reference open-circuit voltage and the second reference open-circuit voltage may be calculated. For example, the first reference open-circuit voltage may be $V_{N32}$ in the above embodiment of the present application, a specific calculation equation for which may can refer to the above equation (4). The second reference open-circuit voltage may be $V_{N31}$ in the above embodiment of the present application, which is 0 in an ideal state. In another example, the first reference open-circuit voltage and the second reference open-circuit voltage may be two values obtained during an experiment simulating a situation where the open-circuit fault occurs in the high-voltage component under detection. Particularly, simulation software may be used to perform the simulation or the open-circuit fault may be simulated by disconnecting the high-voltage component G under detection in an actual circuit.

The fault detection module 11 may also be specifically configured to determine that the short-ground fault occurs in the high-voltage component under detection, under a condition that the high-level voltage of the first detection signal is equal to a first reference short-ground voltage, and/or the low-level voltage of the first detection signal is equal to a second reference short-ground voltage. In an example, the first reference short-ground voltage and the second short-ground voltage may be calculated. For example, the first reference short-ground voltage may be $V_{N42}$ in the above embodiment of the present application, a specific calculation equation for which may can refer to the above equation (5). The second reference open-circuit voltage may be $V_{N41}$ in the above embodiment of the present application, which is 0 in an ideal state. In another example, the first reference short-ground voltage and the second reference short-ground voltage may be two values obtained during an experiment simulating a situation where the short-ground fault occurs in the high-voltage component under detection. Particularly, simulation software may be used to perform the simulation or the open-circuit fault may be simulated by disconnecting the high-voltage component G under detection in an actual circuit.

According to the high-voltage interlocking device of embodiments of the present application, since the end of the second resistance module R2 may have different voltages when the high-voltage component G under detection is in the normal state, short power supply fault state, open-circuit fault state, or short-ground fault state, the fault detection module 11 may determine whether the short power supply fault, open-circuit fault or short-ground fault occur in the high-voltage component G under detection according to the voltage of the end of the second resistance module R2. As compared with an existing scheme which can only determine the open-circuit fault, the present application can improve comprehensiveness of fault detection.

Further, in addition to the determination of a fault occurring in the high-voltage component G under detection and a specific type of the fault, the fault detection module 11 can also determine that the high-voltage component G under detection is in the normal state. Particularly, the fault detection module 11 may also be configured to determine that the high-voltage component G under detection is in the normal state, under a condition that the high-level voltage of the first detection signal is equal to a first reference normal voltage, and/or the low-level voltage of the first detection signal is equal to a second reference normal voltage. In an example, the first reference normal voltage and the second normal voltage may be calculated. For example, the first reference normal voltage may be $V_{N12}$ in the above embodiment of the present application, a specific calculation equation for which may can refer to the above equation (2). The second reference normal voltage may be $V_{N11}$ in the above embodiment of the present application, a specific calculation equation for which may can refer to the above equation (1). In another example, the first reference normal voltage and the second reference normal voltage may be two values obtained during an experiment simulating a situation where the high-voltage component under detection is in the normal state. Particularly, simulation software may be used to perform the simulation or the situation where the high-voltage component under detection does not have a fault may be simulated by disconnecting the high-voltage component G under detection in an actual circuit.

Figure 3:
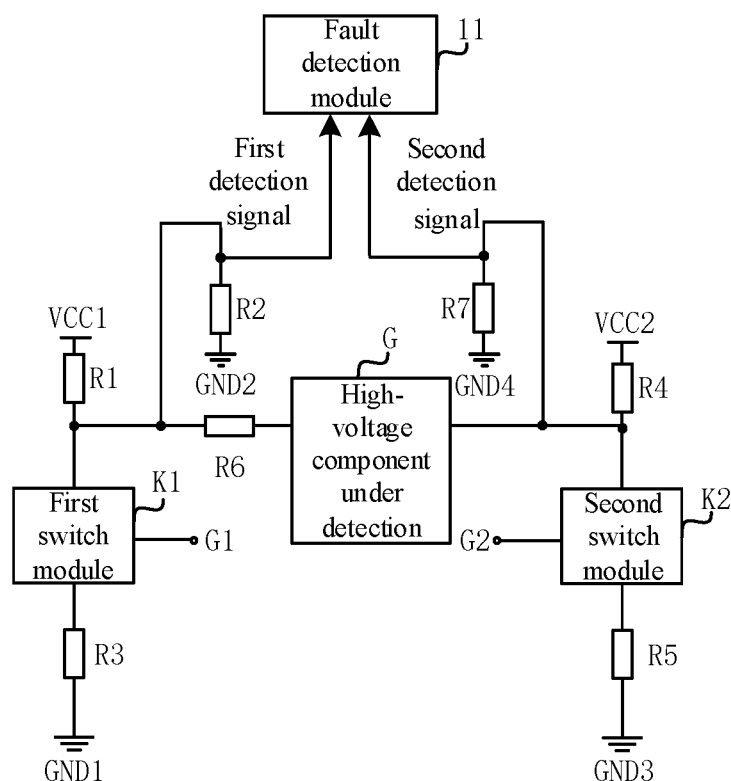
FIG. 3 is a schematic structural diagram of another high-voltage interlocking device, provided by an embodiment of the present application.

FIG. 3 is a schematic structural diagram of another high-voltage interlocking device, provided by an embodiment of the present application. As shown in FIG. 3, a difference between the high-voltage interlocking device and the high-voltage interlocking device shown in conjunction with FIG. 1 is that the high-voltage interlocking device further includes a seventh resistance module R7.

An end of the seventh resistance module R7 is connected to the another end of the high-voltage component G under detection, the end of the fourth resistance module R4, the first connection end of the second switch module K2, and the fault detection module 11, respectively. By connecting with the fault detection module 11, the fault detection module 11 can collect a second detection signal from the end of the seventh resistance module R7. Particularly, the end of the seventh resistance module may be connected to a transmission line between the another end of the high-voltage component G under detection and the end of the fourth resistance module R4.

Another end of the seventh resistance module is connected to a fourth reference potential. Exemplarily, as shown in FIG. 3, the fourth reference potential may be a ground terminal GND4.

Correspondingly, the fault detection module 11 is configured specifically to determine the fault of the high-voltage component G under detection according to the first detection signal and the second detection signal collected from the end of the seventh resistance module R7.

Power of the high-voltage interlocking device and paths through which current flows will be described in details below, in conjunction with on-off states of the first switch module K1 and the second switch module K2 and a state of the high-voltage component G under detection.

I. The high-voltage component G under detection is in a normal state.

Firstly, when the first switch module K1 is turned on and the second switch module K2 is turned off, the power of the high-voltage interlocking device is supplied by the second power terminal VCC2. A difference from the current paths of the high-voltage interlocking device shown in conjunction with FIG. 1 is that a third flow path is further included, i.e., Path 3: the second power terminal VCC2→the fourth resistance module R4→the seventh resistance module R7→the fourth reference potential GND4.

At this time, if the resistance of the high-voltage component under detection in an ideal state is 0, a voltage $V_{NS1}$ of the second detection signal meets an equation (6):

$$V_{NS1} = V_{CC2} \times R_d/(R_d + R_4) \tag{6}$$

In the equation (6), when the sixth resistance module R6 is connected to the end of the high-voltage component G under detection, $R_d$ represents a parallel resistance value of a sum of resistances of $R_a$ and the sixth resistance module R6, and the seventh resistance module R7. When the sixth resistance module R6 is not connected to the end of the high-voltage component G under detection, $R_d$ represents a parallel resistance value of $R_a$ and the seventh resistance module R7.

When the sixth resistance module R6 is connected to the end of the high-voltage component G under detection, the voltage $V_{N11}$ of the first detection signal meets an equation (7):

$$V_{N11} = V_{NS1} \times R_a/(R_a + R_6) \tag{7}$$

When the sixth resistance module R6 is not connected to the end of the high-voltage component G under detection, the voltage $V_{N11}$ of the first detection signal is equivalent to the voltage $V_{NS1}$ of the second detection signal.

Secondly, when the first switch module K1 is turned off and the second switch module K2 is turned on, the power of the high voltage interlocking device is supplied by the first power terminal VCC1. At this time, a difference from the current paths of the high-voltage interlocking device shown in conjunction with FIG. 1 is that a third flow path is further included, i.e., Path 3: the first power terminal VCC1→the sixth resistance module R6 (if the sixth resistance module R6 is not connected to the end of the high-voltage component G under detection, the sixth resistance module R6 is not included)→the high-voltage component G under detection→the seventh resistance module R7→the fourth reference potential.

When the sixth resistance module R6 is connected to the end of the high-voltage component G under detection, if the resistance of the high-voltage component under detection in an ideal state is 0, the voltage $V_{N12}$ of the first detection signal meets an equation (8):

$$V_{N12} = V_{CC1} \times R_e/(R_e + R_1) \tag{8}$$

In the equation (8), when the sixth resistance module R6 is connected to the end of the high-voltage component G under detection, $R_e$ represents a parallel resistance value of a sum of $R_f$ and the sixth resistance module R6, and the second resistance module R2. When the sixth resistance module R6 is not connected to the end of the high-voltage component G under detection, $R_e$ represents a parallel resistance value of $R_f$ and the second resistance module R2, and $R_f$ is a parallel resistance value of the seventh resistance module R7 and the fifth resistance module R5.

In this case, if the resistance of the high-voltage component under detection in an ideal state is 0, a voltage $V_{NS2}$ of the second detection signal meets an equation (9):

$$V_{NS2} = V_{N12} \times R_f/(R_f + R_6) \tag{9}$$

In the equation (9), $V_{N12}$ is the voltage of the first detection signal calculated from the equation (8). In an embodiment, $V_{N12}$ calculated from the equation (8) is larger than $V_{N11}$ calculated from the equation (7). $V_{NS1}$ calculated from the equation (6) is larger than $V_{NS2}$ calculated from the equation (9). When the sixth resistance module R6 is connected to the end of the high-voltage component G under detection, it may be considered that the resistance value of the sixth resistance module R6 is equal to 0.

Figure 4A:
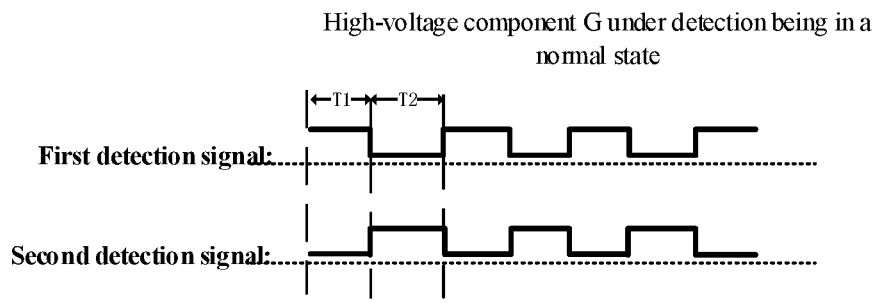
FIG. 4A are exemplary waveform diagrams of a first detection signal and a second detection signal corresponding to a high-voltage component under detection in a normal state, provided by an embodiment of the present application.

As an example, the first detection signal and second detection signal corresponding to the high-voltage component under detection in the normal state of the embodiment of the present application may be the exemplary waveform diagrams shown in FIG. 4A. As shown in FIG. 4A, if the first drive signal and the second drive signal are periodic pulse signals, the first detection signal and second detection signal generated by turning off the first switch module K1 and the second switch module K2 alternately under control of the first drive signal and the second drive signal, are also periodic pulse signals. Particularly, in a first time period T1, the first switch module K1 is turned off and the second switch module K2 is turned on, the first detection signal is a high-level sub-signal $V_{N12}$ and the second detection signal is a low-level signal $V_{NS2}$, as shown in FIG. 4A. In a second time period T2, the first switch module K1 is turned on and the second switch module K2 is turned off, the first detection signal is a low-level sub-signal $V_{N11}$ and the second detection signal is a high-level signal $V_{NS1}$, as shown in FIG. 4A. That is to say, a period of the first signal under detection and a period of the second signal under detection are the same, but the levels are always opposite to each other.

II. A short power supply fault occurs in the high-voltage component G under detection. When the short power supply fault occurs in the high-voltage component G under detection, it can be considered that both ends of the high-voltage component G under detection have high voltages $V_X$.

Firstly, when the first switch module K1 is turned on and the second switch module K2 is turned off, although the power of the high-voltage interlocking device is supplied by the second power terminal VCC2, the end of the high-voltage component G under detection has the high voltage $V_X$. In this case, the first detection signal collected by the first detection module still has the voltage $V_{N21}$ of the first detection signal collected in the above-mentioned embodiments of the present application, the voltage of the short-circuited power supply is greater than the voltage of the second power terminal VCC2, and then $V_{N21}$ is greater than $V_{N11}$ calculated from equation (7).

At this time, a voltage $V_{N61}$ of the second detection signal is equal to the voltage $V_X$ of the short-circuited power supply. $V_{N61}$ is greater than $V_{N21}$.

Secondly, when the first switch module K1 is turned off and the second switch module K2 is turned on, the power of the high voltage interlocking device is supplied by the first power terminal VCC1. In this case, the voltage $V_{N22}$ of the first detection signal equals approximately the voltage $V_X$ of the short-circuited power supply. $V_{N22}$ is larger than $V_{N12}$ and $V_{N22}$ is larger than $V_{N21}$.

At this time, a voltage $V_{N62}$ of the second detection signal is equal to the voltage $V_X$ of the short-circuited power supply. $V_{N62}$ is equal to $V_{N61}$.

Figure 4B:
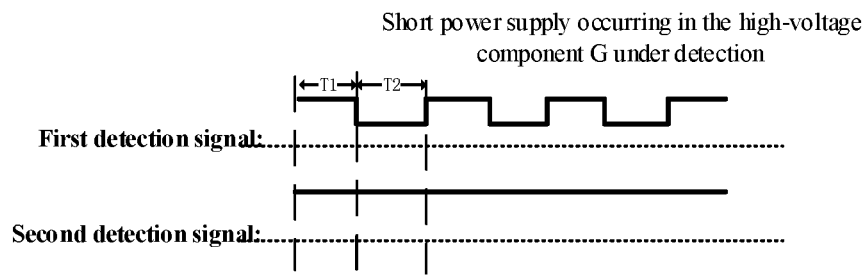
FIG. 4B are exemplary waveform diagrams of a first detection signal and a second detection signal corresponding to a high-voltage component under detection where a short power supply fault occurs, provided by an embodiment of the present application.

As an example, the first detection signal and second detection signal corresponding to the high-voltage component under detection of the embodiment of the present application, where the short power supply fault occurs, may be exemplary waveform diagrams shown in FIG. 4B. In the first time period T1, the first switch module K1 is turned off and the second switch module K2 is turned on, first detection signal is a high-level sub-signal $V_{N22}$, as shown in FIG. 4B. In the second time period T2, the first switch module K1 is turned on and the second switch module K2 is turned off, the first detection signal is a low-level sub-signal $V_{N21}$, as shown in FIG. 4B. Simultaneously, during the first time period T1 and the second time period T2, the second detection signal is a high-level sub-signal $V_{N61}$.

III. An open-circuit fault occurs in the high-voltage component G under detection.

Firstly, when the first switch module K1 is turned on and the second switch module K2 is turned off, the power of the high-voltage interlocking device is supplied by the second power terminal VCC2. In this case, due to the open-circuit fault of the high-voltage component G under detection, a current output by the second power terminal VCC2 cannot flow into a circuit of the end of the high-voltage component G under detection. The voltage $V_{N31}$ of the first detection signal equals approximately 0.

At this time, there is a current path at the another end of the high-voltage component under detection, which is the second power terminal VCC2→the fourth resistance module R4→the seventh resistance module R7→the fourth reference potential GND4. In this case, if the resistance of the high-voltage component under detection in an ideal state is 0, a voltage $V_{N71}$ of the first detection signal meets an equation (10):

$$V_{N71}=V_{CC2} \times R_7/(R_7+R_4) \qquad (10)$$

Secondly, when the first switch module K1 is turned off and the second switch module K2 is turned on, the voltage $V_{N32}$ of the first detection signal may refer to the above equation (4), which will not be repeated here.

Secondly, since the current output from the first power terminal VCC1 cannot flow into the circuit at the another end of the high-voltage component G under detection, the voltage of the second detection signal equals approximately 0.

Figure 4C:
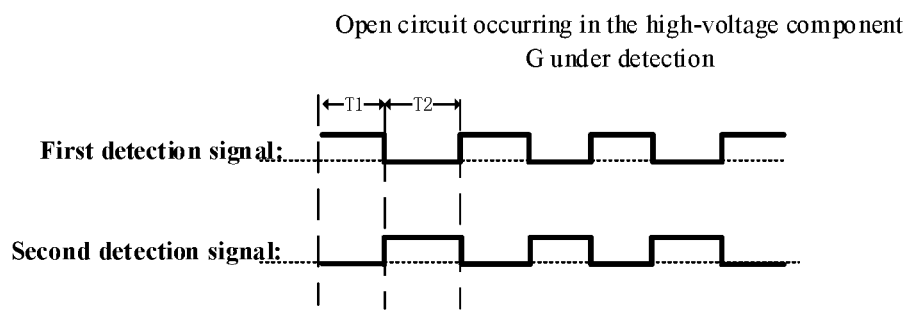
FIG. 4C are exemplary waveform diagrams of a first detection signal and a second detection signal corresponding to a high-voltage component under detection where an open-circuit fault occurs, provided by an embodiment of the present application.

As an example, the first detection signal and second detection signal corresponding to the high-voltage component under detection of the embodiment of the present application, where the open-circuit fault occurs, may be exemplary waveform diagrams shown in FIG. 4C. In the first time period T1, the first switch module K1 is turned off and the second switch module K2 is turned on, the first detection signal is a high-level sub-signal $V_{N32}$ and the second detection signal is a low-level sub-signal $V_{N72}$, as shown in FIG. 4C. In the second time period T2, the first switch module K1 is turned on and the second switch module K2 is turned off, the first detection signal is a low-level sub-signal $V_{N31}$ and the second detection signal is a high-level sub-signal $V_{N71}$, as shown in FIG. 4C.

IV. The high-voltage component G under detection is in a short-ground state, equivalent to that both ends of the high-voltage component G under detection are grounded.

Firstly, when the first switch module K1 is turned on and the second switch module K2 is turned off, the power of the high-voltage interlocking device is supplied by the second power terminal VCC2. In this case, the current cannot flow into the end of the high-voltage component G under detection, and the voltage of the first detection signal is equal to a short-ground voltage. Since the short-ground voltage is 0 in an ideal state, the voltage of the first detection signal is 0 accordingly.

At this time, at the right side of the high-voltage component G under detection in FIG. 3, the current flows through the second power terminal VCC2→the fourth resistance module R4→the another end of the high-voltage component G under detection, and the voltage $V_{N81}$ of the second detection signal is potential of the short-ground terminal. Ideally, the voltage $V_{N81}$ of the second detection signal is 0.

Secondly, when the first switch module K1 is turned off and the second switch module K2 is turned on, the power of the high voltage interlocking device is supplied by the first power terminal VCC1. In this case, the voltage $V_{N42}$ of the first detection signal may refer to relevant content of equation (5).

At this time, the current cannot flow into the another end of the high-voltage component G under detection, and the voltage $V_{N82}$ of the second detection signal in an ideal state is equal to 0.

Figure 4D:
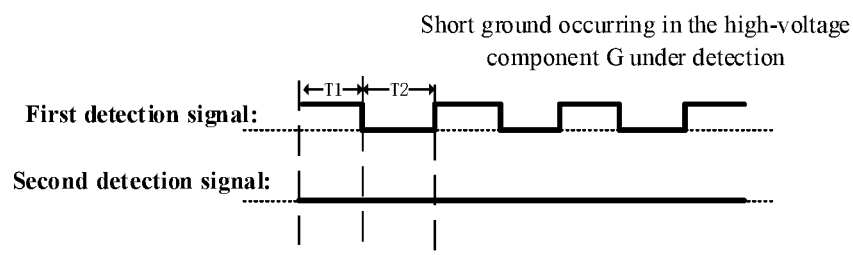
FIG. 4D is are exemplary waveform diagrams of a first detection signal and a second detection signal corresponding to a high-voltage component under detection where a short-ground fault occurs, provided by an embodiment of the present application.

As an example, the first detection signal and the second detection signal corresponding to the high-voltage component under detection of the embodiment of the present application, where the short-ground fault occurs, may be exemplary waveform diagrams shown in FIG. 4D. In the first time period T1, the first switch module K1 is turned off and the second switch module K2 is turned on, the first detection signal is a high-level sub-signal $V_{N42}$ and the voltage $V_{N82}$ of the second detection signal is 0, as shown in FIG. 4D. In the second time period T2, the first switch module K1 is turned on and the second switch module K2 is turned off, the first detection signal is a low-level sub-signal $V_{N41}$ and the voltage $V_{N81}$ of the second detection signal is 0, as shown in FIG. 4D.

Based on the above analysis, in some embodiments, the fault detection module 11 may be specifically configured to determine that the short power supply fault occurs in the high-voltage component under detection, under a condition that a first short power supply determination condition is met, and the first short power supply determination condition includes at least one of following sub-conditions: a high-level voltage of the first detection signal is equal to a first reference short power supply voltage, a low-level voltage of the first detection signal is equal to a second reference short power supply voltage, a high-level voltage of the second detection signal is equal to a third reference short power supply voltage, and a low-level voltage of the second detection signal is equal to a fourth reference short power supply voltage. The third reference short power supply voltage and the fourth reference short power supply voltage may be calculated based on the schematic circuit diagram shown in FIG. 3, or may be two values obtained during an experiment simulating a situation where the short power supply fault occurs in high-voltage component under detection.

The fault detection module 11 may also be specifically configured to determine that the open-circuit fault occurs in the high-voltage component under detection, under a condition that a first open-circuit determination condition is met, and the first open-circuit determination condition includes at least one of following sub-conditions: the high-level voltage of the first detection signal is equal to a first reference open-circuit voltage, the low-level voltage of the first detection signal is equal to a second reference open-circuit voltage, the high-level voltage of the second detection signal is equal to a third reference open-circuit voltage, and the low-level voltage of the second detection signal is equal to a fourth reference open-circuit voltage.

In an example, the third reference open-circuit voltage and the fourth reference open-circuit voltage may be calculated. For example, the third reference open-circuit voltage may be $V_{N71}$ in the above embodiment of the present application, and a specific calculation equation for the third reference open-circuit voltage $V_{N71}$ may can refer to the above equation (9). The fourth reference open-circuit voltage may be $V_{N31}$ in the above embodiment of the present application, which is 0 in an ideal state.

In another example, the third reference open-circuit voltage and the fourth reference open-circuit voltage may be two values obtained during an experiment simulating a situation where the open-circuit fault occurs in the high-voltage component under detection. Particularly, simulation software may be used to perform the simulation or the open-circuit fault may be simulated by disconnecting the high-voltage component G under detection in an actual circuit.

The fault detection module 11 may also be specifically configured to determine that the short-ground fault occurs in the high-voltage component under detection, under a condition that a first short-ground determination condition is met, and the first short-ground determination condition includes at least one of following sub-conditions: the high-level voltage of the first detection signal is equal to a first reference short-ground voltage, the low-level voltage of the first detection signal is equal to a second reference short-ground voltage, the high-level voltage of the second detection signal is equal to a third reference short-ground voltage, and the low-level voltage of the second detection signal is equal to a fourth reference short-ground voltage.

The third reference short ground voltage and fourth reference short ground voltage may refer to relevant content of the high-voltage interlocking device shown in the above embodiment of the present application in conjunction with FIG. 3.

In another example, the third reference short ground voltage and fourth reference short ground voltage may be two values obtained during an experiment simulating a situation where the open-circuit fault occurs in the high-voltage component under detection. Particularly, simulation software may be used to perform the simulation or the open-circuit fault may be simulated by disconnecting the high-voltage component G under detection in an actual circuit.

According to the high-voltage interlocking device of embodiments of the present application, since the end of the second resistance module R2 may have different voltages when the high-voltage component G under detection is in the normal state, short power supply fault state, open-circuit fault state, or short-ground fault state, the fault detection module 11 may determine whether the short power supply fault, open-circuit fault or short-ground fault occur in the high-voltage component G under detection according to the voltage of the end of the second resistance module R2. As compared with an existing scheme which can only determine the open-circuit fault, the present application can improve comprehensiveness of fault detection.

Further, in addition to the determination of a fault occurring in the high-voltage component G under detection and a specific type of the fault, the fault detection module 11 can also determine that the high-voltage component G under detection is in the normal state. Particularly, the fault detection module 11 may also be configured to determine that the high-voltage component G under detection is in the normal state, under a condition that a first normal determination condition is met. The first normal determination condition includes at least one of following sub-conditions: the high-level voltage of the first detection signal is equal to a first reference normal voltage $V_{N12}$, the low-level voltage of the first detection signal is equal to a second reference normal voltage $V_{N11}$, the high-level voltage of the second detection signal is equal to a third reference normal voltage $V_{NS2}$, and the low-level voltage of the second detection signal is equal to a fourth reference normal voltage $V_{NS1}$.

Figure 5:
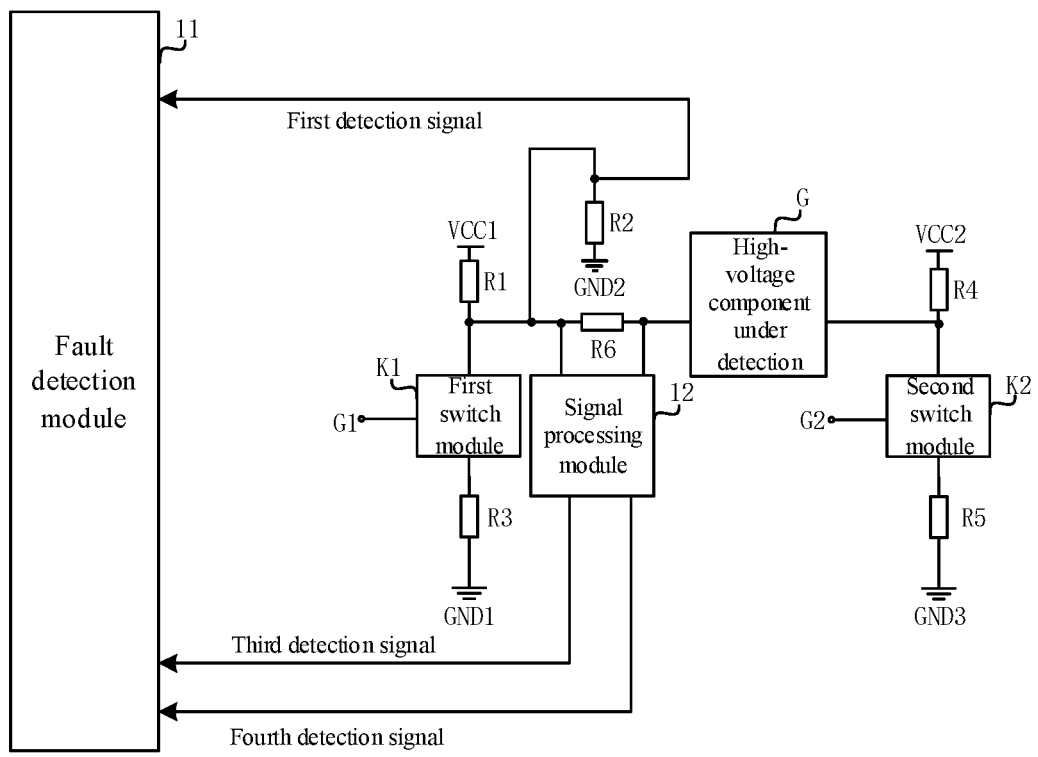
FIG. 5 is a schematic structural diagram of another high-voltage interlocking device, provided by an embodiment of the present application.

FIG. 5 is a schematic structural diagram of another high-voltage interlocking device, provided by an embodiment of the present application. As shown in FIG. 5, the high-voltage interlocking device further includes the sixth resistance module R6 and a signal processing module 12.

An end of the sixth resistance module R6 is connected to the end of the high-voltage component G under detection, and another end of the sixth resistance module R6 is connected to the end of the first resistance module R1, the end of the second resistance module R2, and the first connection end of the first switch module K1, respectively.

The signal processing module 12 is connected across both ends of the sixth resistance module R6. An output end of the signal processing module 12 is connected to the fault detection module 11. The signal processing module 12 is configured to generate a third detection signal and a fourth detection signal according to voltages of both ends of the sixth resistance module, and transmit the third detection signal and the fourth detection signal to the fault detection module 11.

Figure 6:
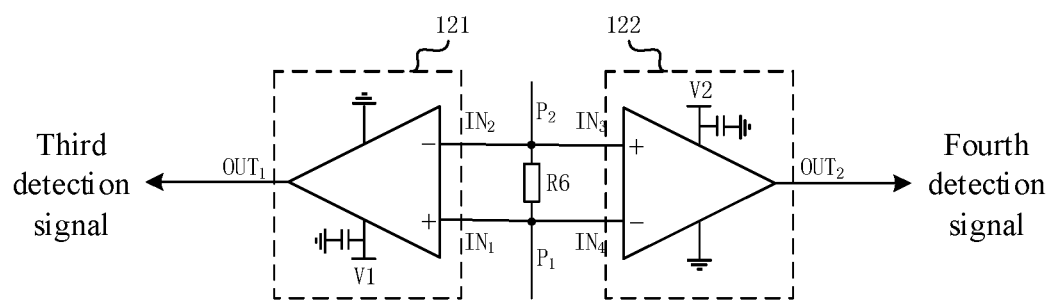
FIG. 6 is a schematic structural diagram of an exemplary signal processing unit, provided by an embodiment of the present application.

In some embodiments, the embodiment of the present application may apply an exemplary signal processing unit as shown in FIG. 6. As shown in FIG. 6, the signal processing module 12 may include a first arithmetic unit 121 and a second arithmetic unit 122. Exemplarily, the first arithmetic unit 121 and the second arithmetic unit 122 may be implemented as a differential operational amplifier or a voltage comparator.

A positive input end $IN_1$ of the first arithmetic unit 121 is connected to the end $P_1$ of the sixth resistance module R6 that is connected to the first resistance module R1. A negative input end $IN_2$ of the first arithmetic unit 121 is connected to the another end $P_2$ of the sixth resistance module R6 that is connected to the high-voltage component G under detection. An output end $OUT_1$ of the first arithmetic unit 121 is connected to the fault detection module 11, and is configured to transmit the third detection signal to the fault detection module 11.

A positive input end $IN_3$ of the second arithmetic unit 122 is connected to the another end $P_2$ of the sixth resistance module R6. A negative input end $IN_4$ of the second arithmetic unit 122 is connected to the end $P_1$ of the sixth resistance module R6. An output end $OUT_2$ of the second arithmetic unit 122 is connected to the fault detection module 11, and is configured to transmit the fourth detection signal to the fault detection module 11.

In some embodiments, the signal processing module 12 may compare the voltages of both ends of the sixth resistance module R6, and generate the third detection signal and the fourth detection signal according to a result of the comparison. Particularly, the signal processing module 12 is configured to adjust the third detection signal to be a high-level signal and the fourth detection signal to be a low-level signal, under a condition that a voltage of the end $P_1$ of the sixth resistance module R6 is higher than a voltage of the another end $P_2$ of the sixth resistance module R6.

The signal processing module 12 is further specifically configured to adjust the third detection signal to be a low-level signal and the fourth detection signal to be a high-level signal, under a condition that the voltage of the end $P_1$ of the sixth resistance module R6 is lower than the voltage of the another end $P_2$ of the sixth resistance module R6.

The signal processing module 12 is further specifically configured to adjust both the third detection signal and the fourth detection signal to be low-level signals, under a condition that the voltage of the end $P_1$ of the sixth resistance module R6 is equal to the voltage of the another end $P_2$ of the sixth resistance module R6.

The third detection signal and the fourth detection signal will be detailed below in conjunction with the state of the high-voltage component G under detection.

I. The high-voltage component G under detection is in a normal state. When the first switch module K1 is turned on and the second switch module K2 is turned off, the power of the high-voltage interlocking device is supplied by the second power terminal VCC2. In this case, the current flows from the second power terminal VCC2 to the first switch module K1, and the voltage of the another end of the sixth resistance module R6 is higher than the voltage of the end of the sixth resistance module R6. Then, the third detection signal is adjusted to be a low level signal and the fourth detection signal is adjusted to be a high level signal.

When the first switch module K1 is turned off and the second switch module K2 is turned on, the power of the high-voltage interlocking device is supplied by the second power terminal VCC1. In this case, the current flows from the first power terminal VCC1 to the second switch module K2, the voltage of the end of the sixth resistance module R6 is higher than the voltage of the another end of the sixth resistance module R6. Then, the third detection signal is adjusted to be a high level signal and the fourth detection signal is adjusted to be a low level signal.

Figure 7A:
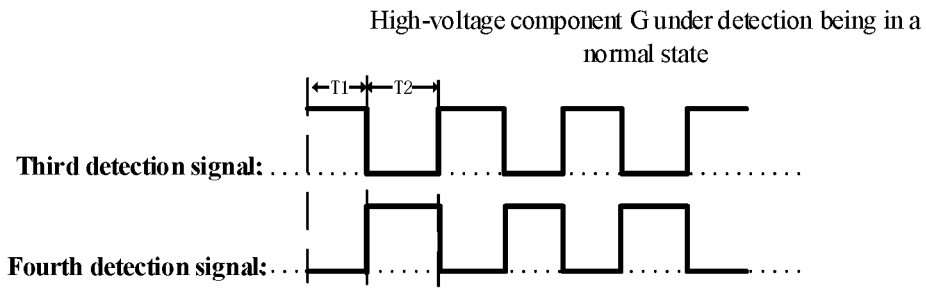
FIG. 7A are exemplary waveform diagrams of a third detection signal and a fourth detection signal corresponding to a high-voltage component under detection in a normal state, provided by an embodiment of the present application.

Exemplarily, the third detection signal and fourth detection signal corresponding to the high-voltage component under detection in the normal state in the embodiment of the present application may be the exemplary waveform diagrams shown in FIG. 7A. As shown in FIG. 7A, the third detection signal and the fourth detection signal are both periodic pulse signals. In a first time period T1, the first switch module K1 is turned off and the second switch module K2 is turned on, the third detection signal is a high-level signal, and the fourth detection signal is a low-level signal. In a second time period T2, the first switch module K1 is turned on and the second switch module K2 is turned off, the third detection signal is a low-level signal and the fourth detection signal is a high-level signal. As shown in FIG. 7A, both the third detection signal and the fourth detection signal include alternate high-level signals and low-level signals, and the third detection signal and the fourth detection signal have opposite levels.

II. A short power supply fault occurs in the high-voltage component G under detection. When the first switch module K1 is turned on and the second switch module K2 is turned off, the first power terminal VCC1 does not supply power to the high-voltage interlocking device. In this case, the current flows from the high-voltage component G under detection to the second resistance module R2, and the voltage of the another end of the sixth resistance module R6 is higher than that of the end of the sixth resistance module R6. Then, the third detection signal is adjusted to be a low level signal and the fourth detection signal is adjusted to be a high level signal.

When the first switch module K1 is turned off and the second switch module K2 is turned on, the first power terminal VCC1 supplies power to the high-voltage interlocking device. In this case, the voltage of the another end of the sixth resistance module R6 is higher than that of the sixth resistance module R6. Then, the third detection signal is adjusted to be a low-level signal and the fourth detection signal is adjusted to be a high-level signal.

Figure 7B:
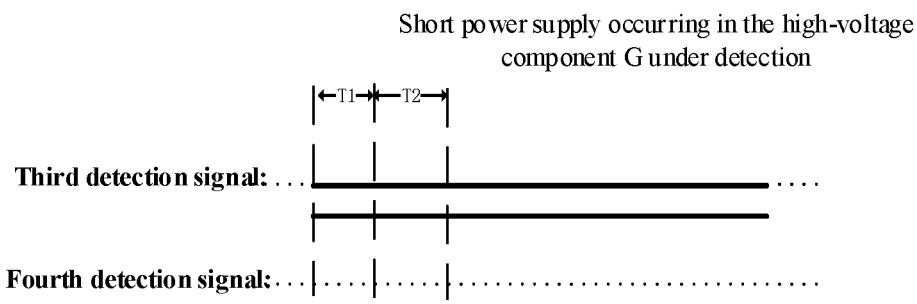
FIG. 7B are exemplary waveform diagrams of a third detection signal and a fourth detection signal corresponding to a high-voltage component under detection where a short power supply fault occurs, provided by an embodiment of the present application.

Exemplarily, the third detection signal and fourth detection signal corresponding to the high-voltage component under detection of the embodiment of the present application, where the short power fault occurs, may be the exemplary waveform diagrams shown in FIG. 7B. As shown in FIG. 7B, during a process of closing the first switch module K1 and the second switch module K2 alternately, the third detection signal is always a low-level signal, and the fourth detection signal is always a high-level signal.

III. An open-circuit fault occurs in the high-voltage component G under detection. When the first switch module K1 is turned on and the second switch module K2 is turned off, the first power terminal VCC1 does not supply power to the high-voltage interlocking device. In this case, no current flows through the sixth resistance module R6, and voltages of both ends of the sixth resistance module R6 are equal. Then, both the third detection signal and fourth detection signal may be adjusted to low-level signals.

When the first switch module K1 is turned off and the second switch module K2 is turned on, the first power terminal VCC1 supplies power to the high-voltage interlocking device. In this case, no current flows through the sixth resistance module R6, and voltages of both ends of the sixth resistance module R6 are equal. Then, both the third detection signal and fourth detection signal may be adjusted to low-level signals.

Figure 7C:
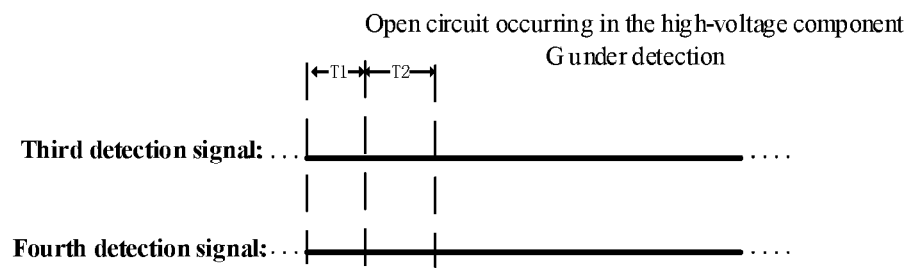
FIG. 7C are exemplary waveform diagrams of a third detection signal and a fourth detection signal corresponding to a high-voltage component under detection where an open-circuit fault occurs, provided by an embodiment of the present application.

Exemplarily, the third detection signal and fourth detection signal corresponding to the high-voltage component under detection of the embodiment of the present application, where the open-circuit fault occurs, may be the exemplary waveform diagrams shown in FIG. 7C. As shown in FIG. 7C, during a process of closing the first switch module K1 and the second switch module K2 alternately, both the third detection signal and fourth detection signal are always low-level signals.

IV. A short-ground fault occurs in the high-voltage component G under detection. When the first switch module K1 is turned on and the second switch module K2 is turned off, the first power terminal VCC1 does not supply power to the high-voltage interlocking device. In this case, no current flows through the sixth resistance module R6, and voltages of both ends of the sixth resistance module R6 are equal. Then, both the third detection signal and fourth detection signal may be adjusted to low-level signals.

When the first switch module K1 is turned off and the second switch module K2 is turned on, the first power terminal VCC1 supplies power to the high-voltage interlocking device. In this case, the current generated by the first power terminal VCC1 can flow through the sixth resistance module R6 and to the end of the high-voltage component G under detection. The voltage of the end of the sixth resistance module R6 is higher than that of the another end of the sixth resistance module R6. The third detection signal is adjusted to be a high-level signal and the fourth detection signal is adjusted to be a low-level signal.

Figure 7D:
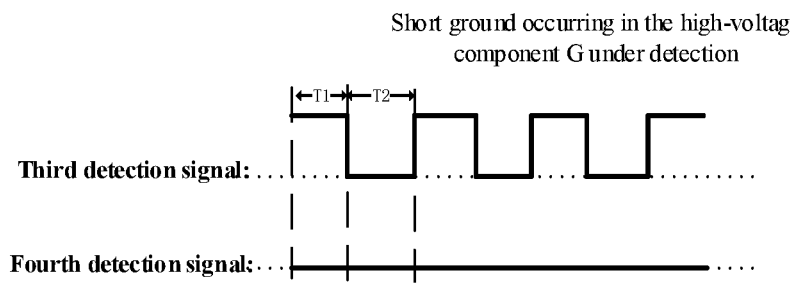
FIG. 7D are exemplary waveform diagrams of a third detection signal and a fourth detection signal corresponding to a high-voltage component under detection where a short-ground fault occurs, provided by an embodiment of the present application.

Exemplarily, the third detection signal and fourth detection signal corresponding to the high-voltage component under detection of the embodiment of the present application, where the short-ground fault occurs, may be the exemplary waveform diagrams shown in FIG. 7D. As shown in FIG. 7D, in the first time period T1, the first switch module K1 is turned off and the second switch module K2 is turned on, the third detection signal is a high-level signal. In the second time period T2, the first switch module K1 is turned on and the second switch module K2 is turned off, the third detection signal is a low-level signal. During the process of closing the first switch module K1 and the second switch module K2 alternately, the fourth detection signal is always a low level signal.

Based on the above analysis in conjunction with FIGS. 7A to 7D, it can be seen that the collected waveform diagrams of the third detection signal and fourth detection signal are different, when the state of the high-voltage component G under detection varies. In some embodiments, the fault detection module 11 may be specifically configured to determine that a short power supply fault occurs in the high-voltage component under detection, under a condition that a second short power supply determination condition is met.

The second short power supply determination condition includes at least one of following sub-conditions: a high-level voltage of the first detection signal is equal to a first reference short power supply voltage, a low-level voltage of the first detection signal is equal to a second reference short power supply voltage, and the third detection signal is always a low-level signal and the fourth detection signal is always a high-level signal. Particularly, it can be judged whether the third detection signal/fourth detection signal is always a low level signal/high level signal, based on the waveforms of the third detection signal and fourth detection signal. Alternatively, the judgment may be performed by calculating a duty ratio of the third detection signal/fourth detection signal. If the calculated duty ratio is equal to 0, the corresponding signal is always a low-level signal; while if the calculated duty ratio is equal to 1, the corresponding signal is always a high-level signal.

The fault detection module 11 may also be specifically configured to determine that the open-circuit fault occurs in the high-voltage component under detection, under a condition that a second open-circuit determination condition is met.

The second open-circuit determination condition includes at least one of following sub-conditions: the high-level voltage of the first detection signal is equal to a first reference open-circuit voltage, the low-level voltage of the first detection signal is equal to a second reference open-circuit voltage, and both the third detection signal and the fourth detection signal are always low-level signals.

The fault detection module 11 may also be specifically configured to determine that the short-ground fault occurs in the high-voltage component under detection, under a condition that a second short-ground determination condition is met.

The second short-ground determination condition includes at least one of following sub-conditions: the high-level voltage of the first detection signal is equal to a first reference short-ground voltage, the low-level voltage of the first detection signal is equal to a second reference short-ground voltage, and the third detection signal includes a high-level signal and a low-level signal and the fourth detection signal is always a low-level signal. Particularly, it can be judged whether the third detection signal and fourth detection signal each include a high-level signal and a low-level signal, based on the waveforms of the third detection signal and fourth detection signal. Alternatively, the judgment may be performed by calculating a duty ratio of the third detection signal/fourth detection signal. If the calculated duty ratio is larger than 0 and smaller than 1, the corresponding signal includes both a high-level signal and a low-level signal.

Since obtaining the third detection signal and fourth detection signal by the signal processing module 12 does not need to use specific voltage values, and the specific fault type of the high-voltage component under detection can be determined only by approaches such as waveform diagrams or calculating a duty ratio, an influence of line resistances and other factors on the sampling voltage can be avoided, such that reliability and accuracy of the detection can be guaranteed. It is especially suitable for specific scenarios where the detection signal transmits a long distance, for which the accuracy of detection can be well maintained.

Further, in addition to the determination of a fault occurring in the high-voltage component G under detection and a specific type of the fault, the fault detection module 11 can also determine that the high-voltage component G under detection is in the normal state. Particularly, the fault detection module 11 may also be configured to determine that the high-voltage component G under detection is in the normal state, under a condition that a second normal determination condition is met.

The second normal determination condition includes at least one of following sub-conditions: the high-level voltage of the first detection signal is equal to a first reference normal voltage, the low-level voltage of the first detection signal is equal to a second reference normal voltage, both the third detection signal and fourth detection signal includes high-level signals and low-level signals. Particularly, it can be judged whether the third detection signal and fourth detection signal each include a high-level signal and a low-level signal, based on the waveforms of the third detection signal and fourth detection signal. Alternatively, the judgment may be performed by calculating a duty ratio of the third detection signal/fourth detection signal. If the calculated duty ratio is larger than 0 and smaller than 1, the corresponding signal includes both a high-level signal and a low-level signal.

It should be noted that the high-voltage interlocking device provided by the embodiments of the present application has strong reliability. When either the first voltage terminal or the second power terminal fails, or the signal detection module 12 fails, the fault of the high-voltage component G under detection can still be detected.

In an embodiment, in order to further improve the reliability of the high-voltage interlocking device, a twelfth resistance module may be arranged between the another end of the component G under detection and the second switch module K2, and another signal detection module may be connected across both ends of the twelfth resistance module. In the high-voltage interlocking device, a position of the twelfth resistance module is symmetric to that of the sixth resistance module R2.

Figure 8:
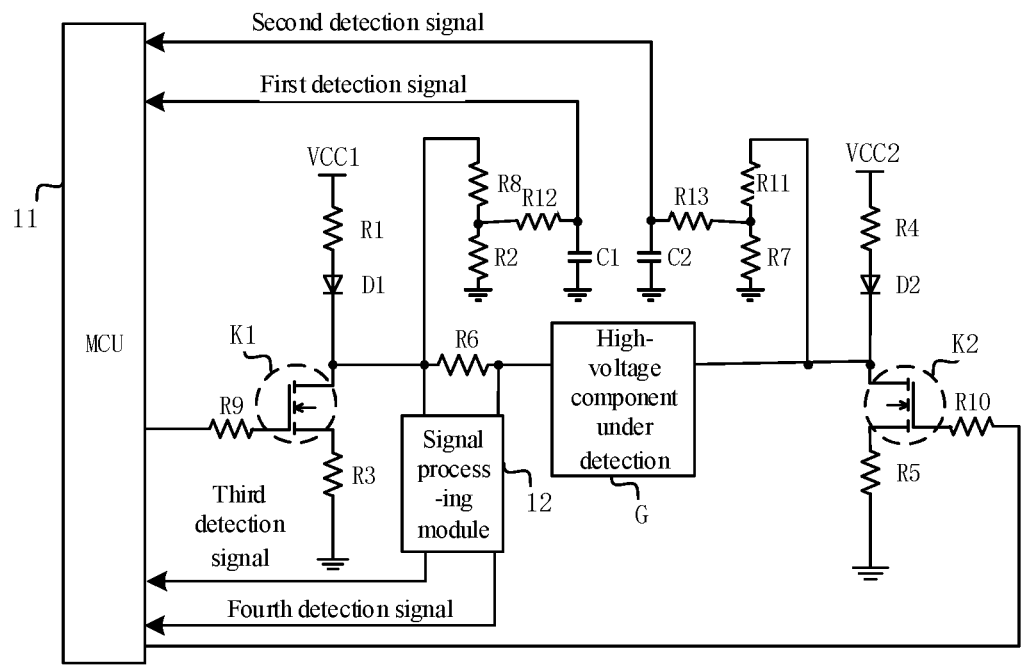
FIG. 8 is a schematic diagram of an exemplary high-voltage interlocking device according to an embodiment of the present application.

FIG. 8 is a schematic diagram of an exemplary high-voltage interlocking device according to an embodiment of the present application. As shown in FIG. 8, the fault detection module 11 may be implemented specifically as an MCU. In addition to diagnosing the fault of the high-voltage component G under detection, the MCU can also output the first driving signal and the second driving signal to the first switch module K1 and the second switch module K2, respectively.

The first switch module K1 may be embodied specifically as a MOS transistor. A gate of the first switch module K1 serves as a control terminal, one of a source and drain of the first switch module K1 serves as the first connection end, and the other of the source and drain serves as the second connection end.

In an embodiment, in order to prevent damaging the first switch module K1 when the first drive signal is too high, the high-voltage interlocking device further includes a ninth resistance module R9 that is connected to the control terminal G1 of the first switch module K1. Exemplarily, as shown in FIG. 8, the MCU is connected to the gate of the first switch module K1 through the ninth resistance module R9.

The second switch module K2 may also be embodied specifically as a MOS transistor. A gate of the second switch module K2 serves as a control terminal, one of a source and drain of the second switch module K2 serves as the first connection end, and the other of the source and the drain of the second switch module K2 serves as the second connection end.

In an embodiment, in order to prevent damaging the second switch module K2 when the second drive signal is too high, the high voltage interlocking device further includes a tenth resistance module R10 that is connected to the control terminal G2 of the second switch module K2. Exemplarily, as shown in FIG. 8, the MCU is connected to the gate of the second switch module K2 through the tenth resistance module R10.

In some embodiments, continuing to refer to FIG. 8, the high-voltage interlocking device further includes an eighth resistance module R8. The eighth resistance module R8 is arranged between the first connection end of the first switch module K1 and the end of the second resistance module R2. Particularly, the second resistance module R2 and eighth resistance module R8 may form a voltage division detection branch. An end of the eighth resistance module R8 is connected to the end of the second resistance module R2, and another end of the eighth resistance module R8 may be connected to a transmission line between the sixth resistance module R6 and the first resistance module R1. A possibility of damaging the MCU may be reduced, because the first detection signal collected by the voltage division detection branch formed by the second resistance module R2 and eighth resistance module R8 is smaller than a voltage collected directly from the end of the sixth resistance module R6.

In an example, continuing to refer to FIG. 8, the high-voltage interlocking device further includes an eleventh resistance module R11. The eleventh resistance module R11 is arranged between the first connection end of the first switch module K2 and the end of the seventh resistance module R7. Particularly, the seventh resistance module R7 and eleventh resistance module R11 may form a voltage division detection branch. An end of the eleventh resistance module R11 is connected to the end of the seventh resistance module R7, and another end of the eleventh resistance module R11 may be connected to a transmission line between the high-voltage component G under detection and the fourth resistance module R4. A possibility of damaging the MCU may be reduced, utilizing that the second detection signal collected by the voltage division detection branch formed by the seventh resistance module R7 and eleventh resistance module R11 is smaller than a voltage collected directly from the another end of the high-voltage component G under detection.

In some embodiments, in order to prevent the first power terminal VCC1 from being damaged due to that the current of the high-voltage interlocking device flows reversely into the first power terminal VCC1, the high-voltage interlocking device may further include a first anti-reverse module. Particularly, the first anti-reverse module is arranged between the first power terminal VCC1 and the high-voltage component G under detection. An input end of the first anti-reverse module is connected to the first power terminal VCC1 through the first resistance module R1, and an output end of the first anti-reverse module is connected to the first connection end of the first switch module K1, the end of the sixth resistance module R6, and the end of the second resistance module R2. Exemplarily, continuing to refer to FIG. 8, the first anti-reverse module may be implemented specifically as a diode D1. An anode of the diode D1 is the input end of the first anti-reverse module, and a cathode of the diode D1 is the output end of the first anti-reverse module.

In some embodiments, in order to prevent the second power terminal VCC2 from being damaged due to that the current of the high-voltage interlocking device flows reversely into the first power terminal VCC2, the high-voltage interlocking device further includes a second anti-reverse module. Particularly, the second anti-reverse module is arranged between the second power terminal VCC2 and the high-voltage component G under detection. An input end of the second anti-reverse module is connected to the second power terminal VCC2 through the fourth resistance module R4, and an output end of the second anti-reverse module is connected to the first connection end of the second switch module K2 and the another end of the high-voltage component G under detection, respectively. If the high-voltage interlocking device further includes the seventh resistance module R7, the output end of the second anti-reverse module may also be directly connected to the seventh resistance module R7, or connected to the seventh resistance module R7 through the eleventh resistance module R11. Exemplarily, continuing to refer to FIG. 8, the second anti-reverse module may be implemented specifically as a diode D2. An anode of the diode D2 is the input end of the second anti-reverse module, and a cathode of the diode D2 is the output end of the second anti-reverse module.

In some embodiments, in order to improve signal quality of the first detection signal, the high-voltage interlocking device may further include a first filter module. Continuing to refer to FIG. 8, the first filter module may include a first resistance unit R12 and a first capacitor unit C1. An end of the first resistance unit R12 is connected to the end of the second resistance module R2, and another end of the first resistance unit R12 is connected to the fault detection module 11 and an end of the first capacitor unit C1, respectively. Another end of the first capacitance unit C1 is connected to a fifth reference potential. Particularly, the end of the first resistance unit R12 may be connected to a connection line between the second resistance module R2 and the eighth resistance module R8.

The signal quality of the first detection signal can be guaranteed, since noise components and high frequency components in the first detection signal may be filtered out by arranging the first filter module.

In some embodiments, in order to improve signal quality of the second detection signal, the high-voltage interlocking device may further include a second filter module. Exemplarily, continuing to refer to FIG. 8, the second filter module includes a second resistance unit R13 and a second capacitance unit C2. An end of the second resistance unit R13 is connected to the end of the seventh resistance module R7. An end of the second resistance unit R13 is connected to the end of the fault detection module 11 and an end of the second capacitance unit C2, respectively. Another end of the second capacitance unit C2 is connected to a sixth reference potential. Particularly, the end of the second resistance unit R13 may be connected to a connection line between the seventh resistance module and the eleventh resistance module.

The signal quality of the second detection signal can be guaranteed, since noise components and high frequency components in the second detection signal may be filtered out by arranging the second filter module.

Figure 9:
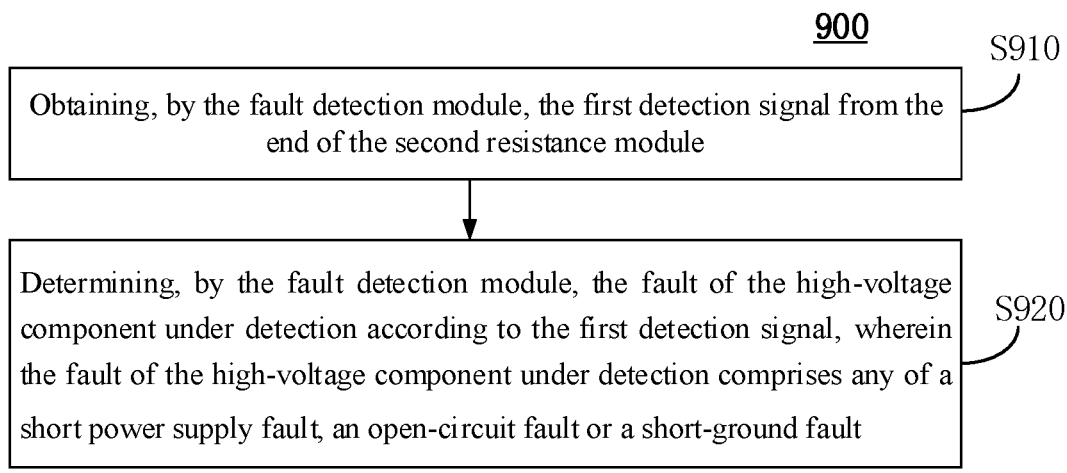
FIG. 9 is a high-voltage interlocking device detection method provided by the present application.

Based on the same application concept, an embodiment of the present application provides a high-voltage interlocking device detection method, which may be applied to the high-voltage interlocking device shown in the above embodiments of the present application in conjunction with FIGS. 1 to 8. FIG. 9 is a high-voltage interlocking device detection method provided by the present application. As shown in FIG. 9, the high-voltage interlocking device detection method 900 includes following steps.

S910: The fault detection module 11 obtains the first detection signal from the end of the second resistance module R2.

S920: The fault detection module 11 determines the fault of the high-voltage component G under detection according to the first detection signal. The fault of the high-voltage component under detection includes any of a short power supply fault, an open-circuit fault or a short-ground fault.

According to the high-voltage interlocking device detection method of embodiments of the present application, since the end of the third resistance module may have different voltages when the high-voltage component under detection is in the normal state, short power supply fault state, open-circuit fault state, or short-ground fault state, the fault detection module may determine whether the short power supply fault, open-circuit fault or short-ground fault occur in the high-voltage component G under detection according to the voltage of the end of the third resistance module. As compared with an existing scheme which can only determine the open-circuit fault, the present application can improve comprehensiveness of fault detection.

In some embodiments, S920 includes, particularly, determining, by the fault detection module, that the short power supply fault occurs in the high-voltage component under detection, under a condition that a high-level voltage of the first detection signal is equal to a first reference short power supply voltage, and/or a low-level voltage of the first detection signal is equal to a second reference short power supply voltage.

Alternatively, the fault detection module 11 determines that the open-circuit fault occurs in the high-voltage component G under detection, under a condition that the high-level voltage of the first detection signal is equal to a first reference open-circuit voltage, and/or the low-level voltage of the first detection signal is equal to a second reference open-circuit voltage.

Alternatively, the fault detection module 11 determines that the short-ground fault occurs in the high-voltage component G under detection, under a condition that the high-level voltage of the first detection signal is equal to a first reference short-ground voltage, and/or the low-level voltage of the first detection signal is equal to a second reference short-ground voltage.

In some embodiments, the high-voltage interlocking device further includes the seventh resistance module R7. An end of the seventh resistance module R7 is connected to the another end of the high-voltage component G under detection, the end of the fourth resistance module R4, the first connection end of the second switch module K2, and the fault detection module 11, respectively; another end of the seventh resistance module R7 is connected to the fourth reference potential.

Correspondingly, S920, includes, particularly, determining, by the fault detection module 11, that the short power supply fault occurs in the high-voltage component under detection, under a condition that a first short power supply determination condition is met. The first short power supply determination condition includes at least one of following sub-conditions: a high-level voltage of the first detection signal is equal to a first reference short power supply voltage, a low-level voltage of the first detection signal is equal to a second reference short power supply voltage, a high-level voltage of the second detection signal is equal to a third reference short power supply voltage, and a low-level voltage of the second detection signal is equal to a fourth reference short power supply voltage.

Alternatively, the fault detection module 11 determines that the open-circuit fault occurs in the high-voltage component G under detection, under a condition that a first open-circuit determination condition is met. The first open-circuit determination condition includes at least one of following sub-conditions: the high-level voltage of the first detection signal is equal to a first reference open-circuit voltage, the low-level voltage of the first detection signal is equal to a second reference open-circuit voltage, the high-level voltage of the second detection signal is equal to a third reference open-circuit voltage, the low-level voltage of the second detection signal is equal to a fourth reference open-circuit voltage.

Alternatively, the fault detection module 11 determines that the short-ground fault occurs in the high-voltage component G under detection, under a condition that a first short-ground determination condition is met. The first short-ground determination condition includes at least one of following sub-conditions: the high-level voltage of the first detection signal is equal to a first reference short-ground voltage, the low-level voltage of the first detection signal is equal to a second reference short-ground voltage, the high-level voltage of the second detection signal is equal to a third reference short-ground voltage, the low-level voltage of the second detection signal is equal to a fourth reference short-ground voltage.

In some embodiments, the high-voltage interlocking device further includes the signal processing module 12 as shown in conjunction with FIG. 5. The signal processing module 12 is connected across both ends of the sixth resistance module R6, and an output end of the signal processing module 12 is connected to the fault detection module 11.

The high-voltage interlocking device detection method 900 further includes that the signal processing module generates a third detection signal and a fourth detection signal according to voltages of both ends of the sixth resistance module, and transmits the third detection signal and the fourth detection signal to the fault detection module.

In some embodiments, the signal processing module 12 generating the third detection signal and the fourth detection signal according to the voltages of both ends of the sixth resistance module R6, and transmitting the third detection signal and the fourth detection signal to the fault detection module, includes particularly following content.

The signal processing module adjusts the third detection signal to be a high-level signal and the fourth detection signal to be a low-level signal, under a condition that a voltage of the end of the sixth resistance module is higher than a voltage of the another end of the sixth resistance module.

The signal processing module adjusts the third detection signal to be a low-level signal and the fourth detection signal to be a high-level signal, under a condition that the voltage of the end of the sixth resistance module is lower than the voltage of the another end of the sixth resistance module, adjusting, by the signal processing module.

The signal processing module adjusts both the third detection signal and the fourth detection signal to be low-level signals, under a condition that the voltage of the end of the sixth resistance module is equal to the voltage of the another end of the sixth resistance module.

In some embodiments, the first driving signal and the second driving signal are both pulse signals, and S920 includes particularly determining, by the fault detection module 11, that the short power supply fault occurs in the high-voltage component G under detection, under a condition that a second short power supply determination condition is met. The second short power supply determination condition includes at least one of following sub-conditions: a high-level voltage of the first detection signal is equal to a first reference short power supply voltage, a low-level voltage of the first detection signal is equal to a second reference short power supply voltage, and the third detection signal is always a low-level signal and the fourth detection signal is always a high-level signal.

Alternatively, the fault detection module 11 determines that the open-circuit fault occurs in the high-voltage component G under detection, under a condition that a second open-circuit determination condition is met. The second open-circuit determination condition includes at least one of following sub-conditions: the high-level voltage of the first detection signal is equal to a first reference open-circuit voltage, the low-level voltage of the first detection signal is equal to a second reference open-circuit voltage, and both the third detection signal and the fourth detection signal are always low-level signals.

Alternatively, the fault detection module 11 determines that the short-ground fault occurs in the high-voltage component G under detection, under a condition that a second short-ground determination condition is met. The second short-ground determination condition includes at least one of following sub-conditions: the high-level voltage of the first detection signal is equal to a first reference short-ground voltage, the low-level voltage of the first detection signal is equal to a second reference short-ground voltage, the third detection signal comprises a high-level signal and a low-level signal and the fourth detection signal is always a low-level signal.

It should be specified that various embodiments in the specification are described in a progressive manner, and the same or similar parts between the various embodiments can be referred to by each other. Each embodiment focuses on differences from other embodiments. Place. The description of the method embodiments is relatively simple, and please refer to the parts describing the system embodiments for related details. The application is not limited to the specific steps and structures described above and shown in the figures. Those skilled in the art can make various changes, modifications and additions, or change the order of steps, after grasping the spirit of the application. For the sake of brevity, a detailed description of known methods and technologies is omitted here.

The functional blocks in the above embodiments may be implemented as hardware, software, firmware, or a combination thereof. When implemented in hardware, the functional blocks may be, for example, electronic circuits, application specific integrated circuits (ASICs), appropriate firmware, plug-ins, function cards, and so on. When implemented in software, elements of the present application may be programs or code segments used to perform required tasks. The programs or code segments may be stored in a machine-readable medium, or may be transmitted on a transmission medium or a communication link via a data signal carried in a carrier wave. "Machine-readable medium" may include any medium that can store or transmit information.

Although the present application has been described with reference to preferred embodiments, various modifications may be made thereto and components thereof may be replaced with equivalents, without departing from the scope of the present application. In particular, as long as there is no structural conflict, various technical features mentioned in various embodiments can be combined in any manner. This application is not limited to the specific embodiments disclosed herein, instead, it can include all technical solutions that fall within the scope of the claims.

What is claimed is:

1. A high-voltage interlocking device, comprising:
   a first resistance module, an end of the first resistance module being connected to a first connection end of a first switch module, a first connection end of a high-voltage component under detection, and an end of a second resistance module, respectively, and another end of the first resistance module being connected to a first power terminal;
   the first switch module, a second connection end of the first switch module being connected to a first reference potential through a third resistance module, and a control terminal of the first switch module being configured to receive a first driving signal to enable the first switch module to be turned on or off according to the first driving signal;
   the second resistance module, another end of the second resistance module being connected to a second reference potential;
   a fourth resistance module, an end of the fourth resistance module being connected to a second connection end of the high-voltage component under detection and a first connection end of a second switch module, and another end of the fourth resistance module being connected to a second power terminal;
   the second switch module, a second connection end of the second switch module being connected to a third reference potential through a fifth resistance module, and a control terminal of the second switch module being configured to receive a second driving signal to enable the second switch module to be turned on or off according to the second driving signal;
   a fault detection module, configured to determine a fault of the high-voltage component under detection according to a first detection signal obtained from the first connection end of the high-voltage component under detection, wherein the fault of the high-voltage component under detection comprises a short power supply fault, an open-circuit fault or a short-ground fault,
   wherein an on-off state of the first switch module is opposite to an on-off state of the second switch module, when the first switch module is turned on, power of the high-voltage interlocking device is supplied by the second power terminal, and when the second switch module is turned on, the power of the high-voltage interlocking device is supplied by the first power terminal.

2. The high-voltage interlocking device of claim 1, wherein,
the first driving signal and the second driving signal are both pulse signals,
the fault detection module is configured to:
under a condition that a high-level voltage of the first detection signal is equal to a first reference short power supply voltage, and/or a low-level voltage of the first detection signal is equal to a second reference short power supply voltage, determine that the short power supply fault occurs in the high-voltage component under detection;
under a condition that the high-level voltage of the first detection signal is equal to a first reference open-circuit voltage, and/or the low-level voltage of the first detection signal is equal to a second reference open-circuit voltage, determine that the open-circuit fault occurs in the high-voltage component under detection;
under a condition that the high-level voltage of the first detection signal is equal to a first reference short-ground voltage, and/or the low-level voltage of the first detection signal is equal to a second reference short-ground voltage, determine that the short-ground fault occurs in the high-voltage component under detection.

3. The high-voltage interlocking device of claim 1, further comprising:
a seventh resistance module, an end of the seventh resistance module being connected to the second connection end of the high-voltage component under detection, the end of the fourth resistance module, the first connection end of the second switch module, and the fault detection module, respectively, and another end of the seventh resistance module being connected to a fourth reference potential;
the fault detection module is configured to determine the fault of the high-voltage component under detection, according to the first detection signal and a second detection signal collected from the end of the seventh resistance module.

4. The high-voltage interlocking device of claim 3, wherein
the first driving signal and the second driving signal are both pulse signals,
the fault detection module is configured to:
determine that the short power supply fault occurs in the high-voltage component under detection, under a condition that a first short power supply determination condition is met, wherein the first short power supply determination condition comprises at least one of following sub-conditions: a high-level voltage of the first detection signal is equal to a first reference short power supply voltage, a low-level voltage of the first detection signal is equal to a second reference short power supply voltage, a high-level voltage of the second detection signal is equal to a third reference short power supply voltage, and a low-level voltage of the second detection signal is equal to a fourth reference short power supply voltage;
determine that the open-circuit fault occurs in the high-voltage component under detection, under a condition that a first open-circuit determination condition is met, wherein the first open-circuit determination condition comprises at least one of following sub-conditions: the high-level voltage of the first detection signal is equal to a first reference open-circuit voltage, the low-level voltage of the first detection signal is equal to a second reference open-circuit voltage, the high-level voltage of the second detection signal is equal to a third reference open-circuit voltage, and the low-level voltage of the second detection signal is equal to a fourth reference open-circuit voltage;
determine that the short-ground fault occurs in the high-voltage component under detection, under a condition that a first short-ground determination condition is met, wherein the first short-ground determination condition comprises at least one of following sub-conditions: the high-level voltage of the first detection signal is equal to a first reference short-ground voltage, the low-level voltage of the first detection signal is equal to a second reference short-ground voltage, the high-level voltage of the second detection signal is equal to a third reference short-ground voltage, and the low-level voltage of the second detection signal is equal to a fourth reference short-ground voltage.

5. The high-voltage interlocking device of claim 3, further comprising:
an eleventh resistance module, arranged between the first connection end of the second switch module and the end of the seventh resistance module.

6. The high-voltage interlocking device of claim 1, further comprising:
a sixth resistance module, an end of the sixth resistance module being connected to the first connection end of the high-voltage component under detection, and another end of the sixth resistance module being connected to the end of the first resistance module, the end of the second resistance module, and the first connection end of the first switch module, respectively;
a signal processing module, connected across both ends of the sixth resistance module, an output end of the signal processing module being connected to the fault detection module, the signal processing module being configured to generate a third detection signal and a fourth detection signal according to voltages of both ends of the sixth resistance module, and transmit the third detection signal and the fourth detection signal to the fault detection module.

7. The high-voltage interlocking device of claim 6, wherein the signal processing module is configured to:
under a condition that a voltage of the end of the sixth resistance module is higher than a voltage of the another end of the sixth resistance module, adjust the third detection signal to be a high-level signal and the fourth detection signal to be a low-level signal;
under a condition that the voltage of the end of the sixth resistance module is lower than the voltage of the another end of the sixth resistance module, adjust the third detection signal to be a low-level signal and the fourth detection signal to be a high-level signal;
under a condition that the voltage of the end of the sixth resistance module is equal to the voltage of the another end of the sixth resistance module, adjust both the third detection signal and the fourth detection signal to be low-level signals.

8. The high-voltage interlocking device of claim 7, wherein the signal processing module comprises:
a first arithmetic unit, a positive input end of the first arithmetic unit being connected to the end of the sixth resistance module, a negative input end being connected to the another end of the sixth resistance module, and an output end of the first arithmetic unit being connected to the fault detection module and configured to transmit the third detection signal to the fault detection module; and a second arithmetic unit, a positive input end of the second arithmetic unit being connected to the another end of the sixth resistance module, a negative input end being connected to the end of the sixth resistance module, and an output end of the second arithmetic unit being connected to the fault detection module and configured to transmit the fourth detection signal to the fault detection module.

9. The high-voltage interlocking device of claim 7, wherein the first driving signal and the second driving signal are both pulse signals, the fault detection module is configured to:

determine that the short power supply fault occurs in the high-voltage component under detection, under a condition that a second short power supply determination condition is met, wherein the second short power supply determination condition comprises at least one of following sub-conditions: a high-level voltage of the first detection signal is equal to a first reference short power supply voltage, a low-level voltage of the first detection signal is equal to a second reference short power supply voltage, and the third detection signal is a low-level signal and the fourth detection signal is a high-level signal;

determine that the open-circuit fault occurs in the high-voltage component under detection, under a condition that a second open-circuit determination condition is met, wherein the second open-circuit determination condition comprises at least one of following sub-conditions: the high-level voltage of the first detection signal is equal to a first reference open-circuit voltage, the low-level voltage of the first detection signal is equal to a second reference open-circuit voltage, and both the third detection signal and the fourth detection signal are low-level signals;

determine that the short-ground fault occurs in the high-voltage component under detection, under a condition that a second short-ground determination condition is met, wherein the second short-ground determination condition comprises at least one of following sub-conditions: the high-level voltage of the first detection signal is equal to a first reference short-ground voltage, the low-level voltage of the first detection signal is equal to a second reference short-ground voltage, and the third detection signal comprises a high-level signal and a low-level signal and the fourth detection signal is a low-level signal.

10. The high-voltage interlocking device of claim 1, further comprising at least one of the following resistance modules:

an eighth resistance module, arranged between the first connection end of the first switch module and the end of the third resistance module;

a ninth resistance module, connected to the control terminal of the first switch module;

a tenth resistance module, connected to the control terminal of the second switch module.

11. The high-voltage interlocking device of claim 1, further comprising:

a first anti-reverse module, arranged between the first power terminal and the high-voltage component under detection, wherein an input end of the first anti-reverse module is connected to the first power terminal through the first resistance module, and an output end of the first anti-reverse module is connected to the first connection end of the first switch module, the end of the second resistance module, and the first connection end of the high-voltage component under detection, respectively; and/or a second anti-reverse module, arranged between the second power terminal and the high-voltage component under detection, wherein an input end of the second anti-reverse module is connected to the second power terminal through the fourth resistance module, and an output end of the second anti-reverse module is connected to the first connection end of the second switch module and the second connection end of the high-voltage component under detection, respectively.

12. The high-voltage interlocking device of claim 1, further comprising:

a first filter module comprising a first resistance unit and a first capacitor unit, an end of the first resistance unit being connected to the end of the second resistance module, another end of the first resistance unit being connected to the fault detection module and an end of the first capacitor unit, respectively, and another end of the first capacitor unit being connected to a fifth reference potential; and/or a second filter module comprising a second resistance unit and a second capacitor unit, an end of the second resistance unit being connected to the end of the seventh resistance module, another end of the second resistance unit being connected to the fault detection module and an end of the second capacitor unit, respectively, and another end of the second capacitor unit being connected to a sixth reference potential.

13. A fault detection method, applicable to a high-voltage interlocking device comprising:

a first resistance module, an end of the first resistance module being connected to a first connection end of a first switch module, a first connection end of a high-voltage component under detection, and an end of a second resistance module, respectively, and another end of the first resistance module being connected to a first power terminal;

the first switch module, a second connection end of the first switch module being connected to a first reference potential through a third resistance module, and a control terminal of the first switch module being configured to receive a first driving signal to enable the first switch module to be turned on or off according to the first driving signal;

the second resistance module, another end of the second resistance module being connected to a second reference potential;

a fourth resistance module, an end of the fourth resistance module being connected to a second connection end of the high-voltage component under detection and a first connection end of a second switch module, and another end of the fourth resistance module being connected to a second power terminal;

the second switch module, a second connection end of the second switch module being connected to a third reference potential through a fifth resistance module, and a control terminal of the second switch module being configured to receive a second driving signal to enable the second switch module to be turned on or off according to the second driving signal;

a fault detection module, configured to determine a fault of the high-voltage component under detection according to a first detection signal obtained from the first connection end of the high-voltage component under detection, wherein the fault of the high-voltage component under detection comprises a short power supply fault, an open-circuit fault or a short-ground fault, wherein an on-off state of the first switch module is opposite to an on-off state of the second switch module, when the first switch module is turned on, power of the high-voltage interlocking device is supplied by the second power terminal, and when the second switch module is turned on, the power of the high-voltage interlocking device is supplied by the first power terminal, the method comprising:
obtaining, by the fault detection module, the first detection signal from the end of the second resistance module; and
determining, by the fault detection module, the fault of the high-voltage component under detection according to the first detection signal;
wherein the fault of the high-voltage component under detection comprises any of a short power supply fault, an open-circuit fault or a short-ground fault.

14. The fault detection method of claim 13, wherein determining, by the fault detection module, the fault of the high-voltage component under detection according to the first detection signal comprises:
under a condition that a high-level voltage of the first detection signal is equal to a first reference short power supply voltage, and/or a low-level voltage of the first detection signal is equal to a second reference short power supply voltage, determining, by the fault detection module, that the short power supply fault occurs in the high-voltage component under detection;
under a condition that the high-level voltage of the first detection signal is equal to a first reference open-circuit voltage, and/or the low-level voltage of the first detection signal is equal to a second reference open-circuit voltage, determining, by the fault detection module, that the open-circuit fault occurs in the high-voltage component under detection;
under a condition that the high-level voltage of the first detection signal is equal to a first reference short-ground voltage, and/or the low-level voltage of the first detection signal is equal to a second reference short-ground voltage, determining, by the fault detection module, that the short-ground fault occurs in the high-voltage component under detection.

15. The fault detection method of claim 13, wherein
the high-voltage interlocking device further comprises a seventh resistance module, an end of the seventh resistance module being connected to the second connection end of the high-voltage component under detection, the end of the fourth resistance module, the first connection end of the second switch module, and the fault detection module, respectively, and another end of the seventh resistance module being connected to a fourth reference potential;
determining, by the fault detection module, the fault of the high-voltage component under detection according to the first detection signal comprises:
determining, by the fault detection module, that the short power supply fault occurs in the high-voltage component under detection, under a condition that a first short power supply determination condition is met, wherein the first short power supply determination condition comprises at least one of following sub-conditions: a high-level voltage of the first detection signal is equal to a first reference short power supply voltage, a low-level voltage of the first detection signal is equal to a second reference short power supply voltage, a high-level voltage of the second detection signal is equal to a third reference short power supply voltage, and a low-level voltage of the second detection signal is equal to a fourth reference short power supply voltage;
determining, by the fault detection module, that the open-circuit fault occurs in the high-voltage component under detection, under a condition that a first open-circuit determination condition is met, wherein the first open-circuit determination condition comprises at least one of following sub-conditions: the high-level voltage of the first detection signal is equal to a first reference open-circuit voltage, the low-level voltage of the first detection signal is equal to a second reference open-circuit voltage, the high-level voltage of the second detection signal is equal to a third reference open-circuit voltage, the low-level voltage of the second detection signal is equal to a fourth reference open-circuit voltage;
determining, by the fault detection module, that the short-ground fault occurs in the high-voltage component under detection, under a condition that a first short-ground determination condition is met, wherein the first short-ground determination condition comprises at least one of following sub-conditions: the high-level voltage of the first detection signal is equal to a first reference short-ground voltage, the low-level voltage of the first detection signal is equal to a second reference short-ground voltage, the high-level voltage of the second detection signal is equal to a third reference short-ground voltage, the low-level voltage of the second detection signal is equal to a fourth reference short-ground voltage.

16. The fault detection method of claim 13, the high-voltage interlocking device further comprises a signal processing module, connected across both ends of the sixth resistance module, an output end of the signal processing module being connected to the fault detection module;
the method further comprises: generating a third detection signal and a fourth detection signal according to voltages of both ends of the sixth resistance module, and transmitting the third detection signal and the fourth detection signal to the fault detection module, by the signal processing module.

17. The fault detection method of claim 16, wherein generating a third detection signal and a fourth detection signal according to voltages of both ends of the sixth resistance module, and transmitting the third detection signal and the fourth detection signal to the fault detection module, by the signal processing module, comprises:
under a condition that a voltage of the end of the sixth resistance module is higher than a voltage of the another end of the sixth resistance module, adjusting, by the signal processing module, the third detection signal to be a high-level signal and the fourth detection signal to be a low-level signal;
under a condition that the voltage of the end of the sixth resistance module is lower than the voltage of the another end of the sixth resistance module, adjusting, by the signal processing module, the third detection signal to be a low-level signal and the fourth detection signal to be a high-level signal;

under a condition that the voltage of the end of the sixth resistance module is equal to the voltage of the another end of the sixth resistance module, adjusting, by the signal processing module, both the third detection signal and the fourth detection signal to be low-level signals.

18. The fault detection method of claim 17, wherein the first driving signal and the second driving signal are both pulse signals, and determining, by the fault detection module, the fault of the high-voltage component under detection according to the first detection signal comprises:

determining, by the fault detection module, that the short power supply fault occurs in the high-voltage component under detection, under a condition that a second short power supply determination condition is met, wherein the second short power supply determination condition comprises at least one of following sub-conditions: a high-level voltage of the first detection signal is equal to a first reference short power supply voltage, a low-level voltage of the first detection signal is equal to a second reference short power supply voltage, and the third detection signal is always a low-level signal and the fourth detection signal is always a high-level signal;

determining, by the fault detection module, that the open-circuit fault occurs in the high-voltage component under detection, under a condition that a second open-circuit determination condition is met, wherein the second open-circuit determination condition comprises at least one of following sub-conditions: the high-level voltage of the first detection signal is equal to a first reference open-circuit voltage, the low-level voltage of the first detection signal is equal to a second reference open-circuit voltage, and both the third detection signal and the fourth detection signal are always low-level signals;

determining, by the fault detection module, that the short-ground fault occurs in the high-voltage component under detection, under a condition that a second short-ground determination condition is met, wherein the second short-ground determination condition comprises at least one of following sub-conditions: the high-level voltage of the first detection signal is equal to a first reference short-ground voltage, the low-level voltage of the first detection signal is equal to a second reference short-ground voltage, the third detection signal comprises a high-level signal and a low-level signal and the fourth detection signal is a low-level signal.

* * * * *